(12) United States Patent
Chao et al.

(10) Patent No.: US 7,514,775 B2
(45) Date of Patent: Apr. 7, 2009

(54) STACKED STRUCTURES AND METHODS OF FABRICATING STACKED STRUCTURES

(75) Inventors: Clinton Chao, Hsinchu (TW);
Tsorng-Dih Yuan, Hsinchu (TW);
Hsin-Yu Pan, Taipei (TW); Kim Chen, Fremont, CA (US); Mark Shane Peng, Hsinchu (TW); Tjandra Winata Karta, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 166 days.

(21) Appl. No.: 11/539,814

(22) Filed: Oct. 9, 2006

(65) Prior Publication Data

US 2008/0083975 A1 Apr. 10, 2008

(51) Int. Cl.
*H01L 23/498* (2006.01)
(52) U.S. Cl. .............. 257/686; 257/698; 257/706; 257/777; 257/E23.063
(58) Field of Classification Search .......... 257/686, 257/698, 706, 777, E23.063
See application file for complete search history.

(56) References Cited

U.S. PATENT DOCUMENTS 6,717,251 B2 * 4/2004 Matsuo et al. .............. 257/686
6,867,501 B2 * 3/2005 Shibata ....................... 257/778

* cited by examiner

*Primary Examiner*—Evan Pert
*Assistant Examiner*—Victor A Mandala
(74) *Attorney, Agent, or Firm*—Duane Morris LLP

(57) ABSTRACT

A stacked structure includes a first die coupled to a first substrate and having a first conductive structure formed through the first die. A second die is mounted over the first die. The second die is coupled to the first substrate by the first conductive structure. At least one first support structure formed from a second substrate is provided over the first substrate, adjacent to at least one of the first die and the second die. A top surface of the first support structure is substantially coplanar with a top surface of at least one of the first and second dies adjacent to the first support structure. The stacked structure further includes a heat spreader mounted over the second die.

21 Claims, 27 Drawing Sheets

STACKED STRUCTURES AND METHODS OF FABRICATING STACKED STRUCTURES

BACKGROUND OF THE INVENTION

1. Field of the Invention

The present invention relates to semiconductor structures and methods of forming semiconductor structures, and more particularly to stacked structures and methods of fabricating stacked structures.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed goals, dimensions of semiconductor integrated circuits continue to shrink. Various materials and techniques have been proposed to achieve these integration and speed goals and to overcome manufacturing obstacles associated therewith. In order to achieve these goals, a stacked structure including multiple substrates has been proposed to enhance operational speed of circuits.

FIG. 1 is a cross-sectional view of a prior art stacked structure.

A stacked structure 100 includes dies 120, 130 and 140 sequentially mounted over a substrate 110, which includes bump structures 105. Generally, dies 120, 130 and 140 with different circuits provide different functionalities. Thus, dimensions of dies 120, 130 and 140 may be different from each other. The die 120 is coupled to the substrate 110 by bump structures 115. An underfill layer 117 is introduced between the die 120 and substrate 110. The die 120 includes conductive structures 123 formed therethrough. Also, the die 130 includes conductive structures 133 formed therethrough. The dies 120 and 130 are coupled to each other by bonding pads 125 between the dies 120 and 130. The die 140 includes conductive structures 143 formed therethrough. The die 140 is coupled to the die 130 by the bonding pads 135.

Before being joined together, the dies 120, 130 and 140 are subjected to electrical tests for identifying inoperative dies. If the dies 120, 130 and 140 pass these electrical performance tests, they are mounted over the substrate 100. Otherwise, the dies will be discarded. Each of the dies 120, 130 and 140 includes an active region (not shown) including transistors, diodes and circuits formed over surfaces 121, 131 and 141, respectively. The operation of these active regions generates heat, for example, at locations "a," "b" and/or "c" on the surfaces 121, 131 and 141 of the dies 120, 130 and 140, respectively. In some situations, heat created at these locations can be dissipated by the surfaces 122, 132 and/or 142. If heat cannot be dissipated, the accumulated heat at the active regions may cause the failure of the dies 120, 130 and 140 in the stacked structure, even though each of the dies 120, 130 and 140 passed the requisite electrical tests before mounting.

Further, electrical signals generated near to the location "a" must be transmitted by a metal pattern (not shown) formed on the surface 121 of the die 120 through the conductive structures 123, 125, 133 and 135 to the die 140. The metal pattern used to transmitted signals is complex. This complicated metal pattern may increase parasitic capacitances between neighboring metal lines of the metal pattern. These parasitic capacitances may adversely affect electrical performance of the stacked structure.

From the foregoing, improved stacked structures and methods of forming stacked structures are desired.

SUMMARY OF THE INVENTION

In some embodiments, a stacked structure comprises a first die and a second die. The first die is coupled to a first substrate and has a first conductive structure formed through the first die. The second die is mounted over the first die. The second die is coupled to the substrate by the first conductive structure. At least one first support structure formed from a second substrate is provided over the first substrate, adjacent to at least one of the first die and the second die. A top surface of the first support structure is substantially coplanar with a top surface of at least one of the first and second dies adjacent thereto. The stacked structure further includes a heat spreader mounted over the second die.

In some embodiments, a method of forming a stacked structure comprises (a) mounting a first die and a second die sequentially over a first substrate; (b) providing at least one first support structure over the first substrate, wherein the first support structure is adjacent to at least one of the first die and the second die and has a top surface substantially coplanar with a top surface of at least one of the first die and second die adjacent thereto, wherein the top surface of the support structure has an area of about 20% or more of a die area of a larger one of the first and second dies; and (c) mounting a heat spreader over the second die.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

Figure 1:
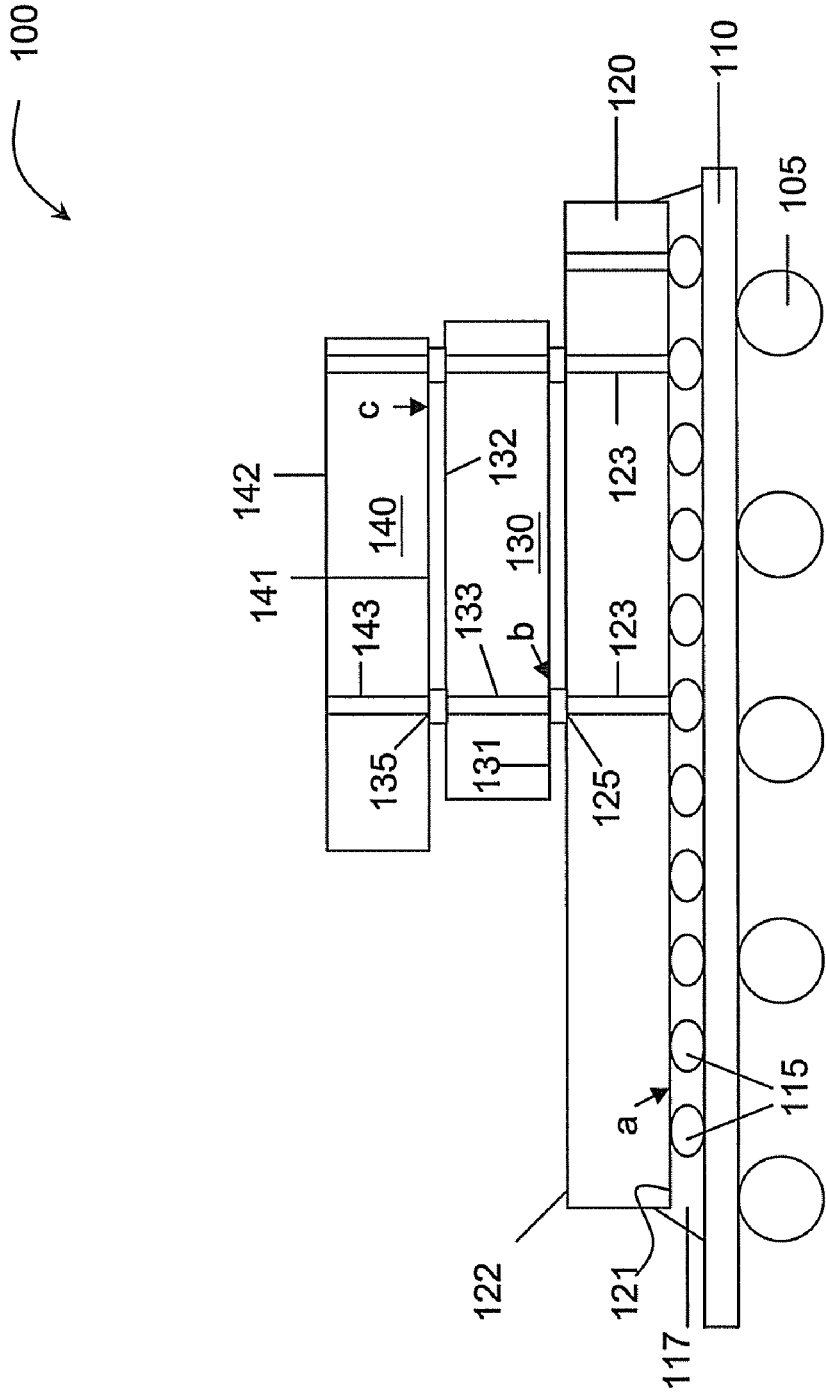
FIG. 1 is a cross-sectional view of a prior art stacked structure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2D are schematic cross-sectional views showing exemplary stacked structures.

Figure 2A:
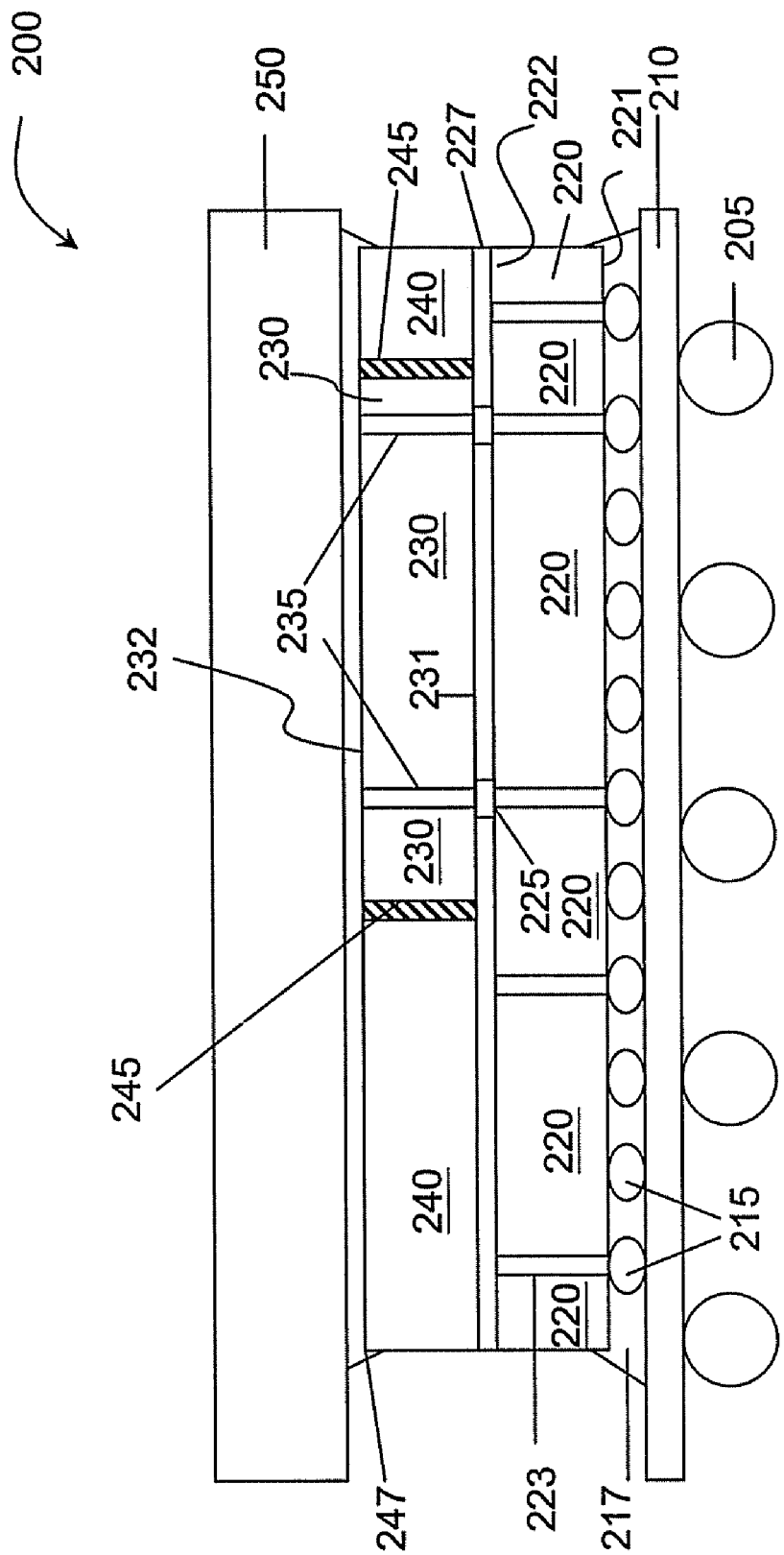
FIGS. 2A-2E are schematic cross-sectional views showing exemplary stacked structures.

As shown in FIG. 2A, a stacked structure 200 comprises dies 220 and 230 sequentially mounted over a substrate 210, such as a printed circuit board (PCB). In some embodiments, methods of mounting the dies 220 and 230 and structures of the dies 220 and 230 are described in, for example, commonly assigned and copending U.S. patent application Ser. No. 11/563,973, filed on Nov. 28, 2006, the entirety of which is hereby incorporated by reference herein.

Bump structures 205 are disposed under the substrate 210. The bump structures 205 are formed to provide mechanical and electrical connection between the substrate 210 and another substrate (not shown) such as a printed circuit board (PCB). In some embodiments, the die 220 is mounted over the substrate 210 by, for example, a ball grid array (BGA) process or wire bonding process. The die 220 may be coupled to the substrate 210 by bump structures 215, for example. Further, an underfill layer 217, such as an epoxy layer, may be formed between the substrate 210 and die 220 to isolate the bump structures 215 and enhance the mechanical strength of the structure shown in FIG. 2A.

The die 220 may comprise a P-type or N-type silicon substrate, III-V compound substrate, display substrate such as a liquid crystal display (LCD), plasma display, electro luminescence (EL) lamp display, or light emitting diode (LED) substrate. In some embodiments, the die 220 comprise, for example, a memory, digital circuit, analog circuit, system-on-chip (SOC), graphic processing unit. (GPU) or other chip including a variety of diodes, transistors and circuits formed therein. The die 220 also comprises at least one conductive structure, e.g., conductive structures 223 formed therethrough. The conductive structures 223 provide electrical and/or thermal coupling between the surface 221 of the die 220 attached to the bump structures 215 and an opposite surface 222 of the die 220 attached to the die 230. A detailed description of the conductive structures 223 is provided below in connection with FIGS. 4A-4B. The die 220 also may comprise an active region (not shown) in which transistors, devices and/or circuits (not shown) are formed. The active region of the die 220 can be formed at the surface 221 of the die 220 attached to the bump structures 215 or the surface 222 of the die 220 attached to the die 230. By way of the bump structures 215, the active region formed on the surface 221 or surface 222 is electrically coupled to the bump structures 205 by a conductive structure (not shown), e.g., a metal pattern, formed within or on the substrate 210.

In some embodiments, the die 220 is divided from a substrate (not shown), e.g., a wafer, which includes a plurality of dies that are the same as, or similar to, the die 220. Before being subjected to a die-sawing process, the substrate is subjected to electrical tests, e.g., wafer acceptance test (WAT) or other electrical performance tests, to determine acceptability of the dies. After the electrical tests, the substrate is subjected to a backside milling process for thinning the substrate before sawing. After a sawing process, the passing die 220 is then mounted over the substrate 210.

The die 230 is mounted over the die 220 between isolation structures 245, which are shown with cross-hatching to differentiate them from conductive structures, e.g. conductive structures 235 and 223 as shown in FIG. 2A. The isolation structures 245 may comprise, for example, epoxy or other material suitable for use as an underfill. The isolation structures 245 may be discrete regions, or may be part of a continuous ring extending around the die 230. The die 230 may be mounted over the die 220 by, for example, a metal bonding process, oxide bonding process or adhesive bonding process.

In some embodiments, the die 230 is flipped and mounted to the die 220. In other embodiments, the die 230 is directly mounted to the die 220 without flipping. The support structures 240 are provided between the die 220 and heat spreader 250. A detailed description of the support structures is provided below.

In some embodiments, the dimensions of the die 230 are smaller than those of the die 220, at least in the length (horizontal) dimension shown in FIG. 2A. The die 230 may comprise a P-type or N-type silicon substrate, III-V compound substrate, display substrate such as a liquid crystal display (LCD), plasma display, electro luminescence (EL) lamp display, or light emitting diode (LED) substrate. In some embodiments, the die 230 may also comprise at least one conductive structure, e.g., conductive structures 235, formed therethrough. The conductive structures 235 provide electrical and/or thermal coupling between the surface 232 of the die 230 attached to a heat spreader 250 and another surface 231 of the die 230 attached to the die 220. In some embodiments, the conductive structures 235 are the same as or similar to the conductive structures 223 as described above. Further, the die 230 may comprise an active region (not shown) in which transistors, devices and/or circuits (not shown) are formed. The active region of the die 230 can be formed at the surface 232 of the die 230 attached to the heat spreader 250 or the surface 231 of the die 230 attached to the die 220. Further, the active region of the die 230 is coupled to the active region of the die 220 by at least one conductive structure 225, such as pads or bumps. The active region formed on the surface 231 or surface 232 can be electrically coupled to the bump structures 215 by the conductive structures 223 and 225. The conductive structures 225 may comprise, for example, an aluminum (Al) layer, copper (Cu) layer, AlCu layer, gold (Au) layer, lead-tin (PbSn) layer or other conductive material layer. In some embodiments, an isolation layer 227, such as an epoxy layer, is introduced between the dies 220 and 230 to isolate the active regions of the dies 220 and 230 and the conductive structures 225. In some embodiments, the isolation layer 227 and isolation structures 245 are formed from the same or similar material and can be formed by the same process such as dispensing or coating technologies. It is understood that the isolation layers 227 and/or 245 are optional, if isolation between the die 230 and support substrate 240 or between conductive structures 225 is not a concern.

In some embodiments, the conductive structures 225 are formed first over the die 220, and the conductive structures 235 of the die 230 are then attached thereto. In other embodiments, the conductive structures 225 are formed on the surface 231 of the die 230, and the conductive structures 225 of the die 230 are then attached to the conductive structures 223 of the die 220. In still other embodiments, each of the dies 220 and 230 comprises conductive structures (not shown) which together form the conductive structures 225 when the conductive structures of the dies 220 and 230 are attached to each other.

In some embodiments, the die 230 is divided from a substrate (not shown), e.g., a wafer, which includes a plurality of dies that are the same as, or similar to, the die 230. Processes for forming the die 230 may be similar to those described in connection with the die 220. After electrical testing, a wafer milling process and a die-sawing process, the passing die 230 is mounted over the die 220.

In some embodiments as shown in FIG. 2A, the support structures 240 are provided over the die 220. The support structures 240 are adjacent or abutting the die 230, which extends to the isolation structures 245 and have a height substantially equal to that of the die 230. In other words, the top surface of the support structure 240 is substantially coplanar with the top surface 232 of the die 230. In some embodiments, the area of the top surface of the support structure 240 is about 20% or more of the die area of the larger of dies 220 and 230. For example, as shown in FIG. 2A, the die 220 is larger than the die 230, and the top surface area of the support structure 240 is about 20% or more of the die area of die 220. The die area of the die 220 may be the physical dimensions of the top surface 222 or a die area defined by scribe lines (not shown) around the die. In some embodiments, the support structure 240 may be formed from a substrate 270 as shown in FIG. 2G, such as a silicon substrate, III-V compound substrate, printed circuit board (PCB), conductive substrate, plastic substrate or other substrate through which a conductive structure can be formed. After the formation of the support structures 240 within the substrate 270, the substrate 270 may be subjected to a backside milling step and a sawing step along gaps (not labeled) between the support structures 240. In some embodiments as shown in FIG. 2A, no conductive structure is formed passing through the support structures 240. In these embodiments, the support structures 240 are located between the heat spreader 250 and die 220 to provide desired mechanical support when the heat spreader 250 is mounted over the die 240.

In some embodiments, the support structure 240 is divided from a substrate (not shown) which includes a plurality of structures that are the same as or similar to the support structure 240. The substrate (not shown) including a plurality of the support structures 240 is cut so as to obtain components having the desired dimensions. Before sawing the substrate (not shown) from which structures 240 are cut, the substrate is subjected to a backside milling process for thinning the substrate.

In other embodiments, the support structures 240 and die 230 are regions (e.g., support region and die region) formed on the same substrate and by the same process. In these embodiments, the isolation structures 245 can be, for example, replaced by defined isolation regions (which are voids or spaces, or an empty ring) in the substrate between the support structures 240 and die 230. In still other embodiments as shown in FIG. 2F, the isolation regions (e.g., isolation structures 245) are omitted. A scribe line region 231 is formed around the support structure region 240 and the die region 230. In other words, the support region 240 is defined to occupy the whole region between the scribe line region 231 and the die region 230. In the example of FIG. 2F, the support region 240 between the die region 230 and the scribe line region 231 has a width "w" of about 150 μm or more.

The substrate, including the support structures 240 and die regions 230, is subjected to electrical tests, a backside milling process and a die sawing process to obtain chips, each of which includes a respective support structure(s) 240 and die 230. The chip is then mounted over the die 220.

The heat spreader 250 is mounted over the die 230 and coupled to the region containing die 230 by an adhesive layer 247, such as a thermally conductive material layer. The heat spreader 250 may comprise, for example, an Al layer, Cu layer, AlCu layer or other thermally conductive material layer. Heat created at the active regions (not shown) of the dies 220 and 230, e.g., on the surfaces 221 and 231 of the dies 220 and 230, respectively, can be conducted by the conductive structures 223, 225, 235 and/or the adhesive layer 247 to the heat spreader 250 and dissipated therefrom. As set forth above, the support structures 240 are disposed over the die 220 and have a height substantially equal to that of the die 230. The die 230 and the support structures 240 thus provide a substantially coplanar surface upon which the heat spreader 250 is mounted. Accordingly, even if the die 230 is substantially smaller than the die 220, the support structures 240 can provide desired mechanical support for the mounting of the heat spreader 250.

In some embodiments, the support structure 240 comprises a plurality of substrates that are sequentially mounted. For example, the support structure 240 may comprise two stacked substrates (not shown). The total height of the stacked substrates is substantially equal to that of the die 230 such that the top surface of the stacked substrates is substantially coplanar with the top surface 232 of the die 230. A multi-substrate support structure 240 is acceptable if it can provide desired mechanical support, electrical transmission and/or thermal dissipation as set forth above or described below.

Figure 2B:
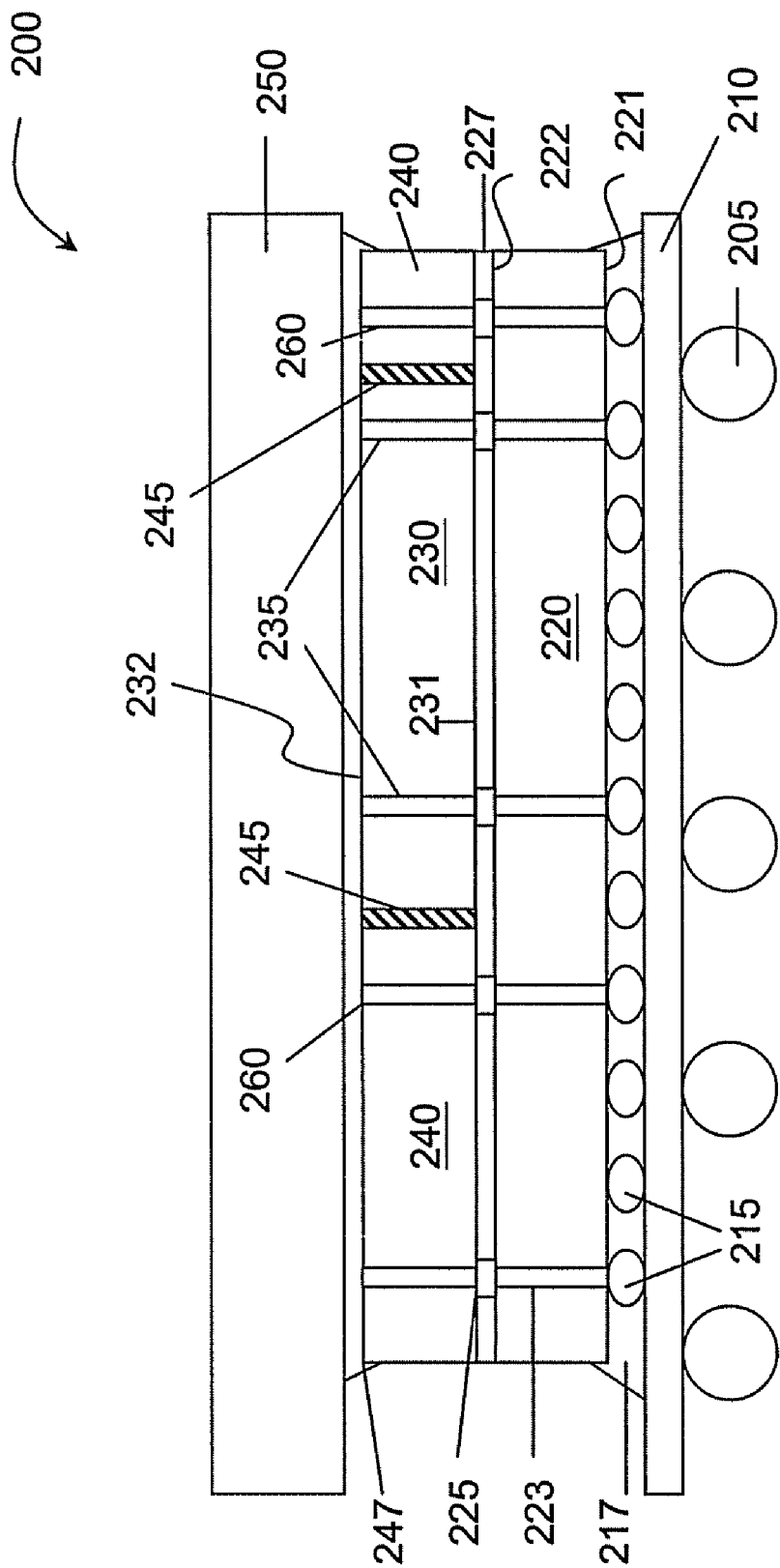

FIG. 2B is a schematic cross-sectional view of an exemplary stacked structure in which the support structure 240 comprises at least one conductive structure, such as conductive structures 260, formed therethrough. Like items shown in FIGS. 2A and 2B are identified by the same reference numerals. A detailed description of the conductive structure 260 is provided below in connection with FIGS. 4A-4B. As shown in FIG. 2B, heat created at the surface 221 of the die 220 attached to the bump structures 215 is dissipated not only by the conductive structures 223, 225, 235 and the adhesive layer 247 to the heat spreader 250, but also by the conductive structures 223, 225, 260 and the adhesive layer 247 to the heat spreader 250. Further, heat created at the surfaces 222 and 231 of the dies 220 and 230, respectively, can be conducted not only by way of the conductive structures 235 and the adhesive layer 247 to the heat spreader 250, but also by the conductive structures 260 and the adhesive layer 247 to the heat spreader 250. Accordingly, the support structures 240 are configured between the heat spreader 250 and the die 220 to provide desired mechanical support for the mounting of the heat spreader 250 and also to provide desired thermal dissipation channels therebetween.

Figure 2C:
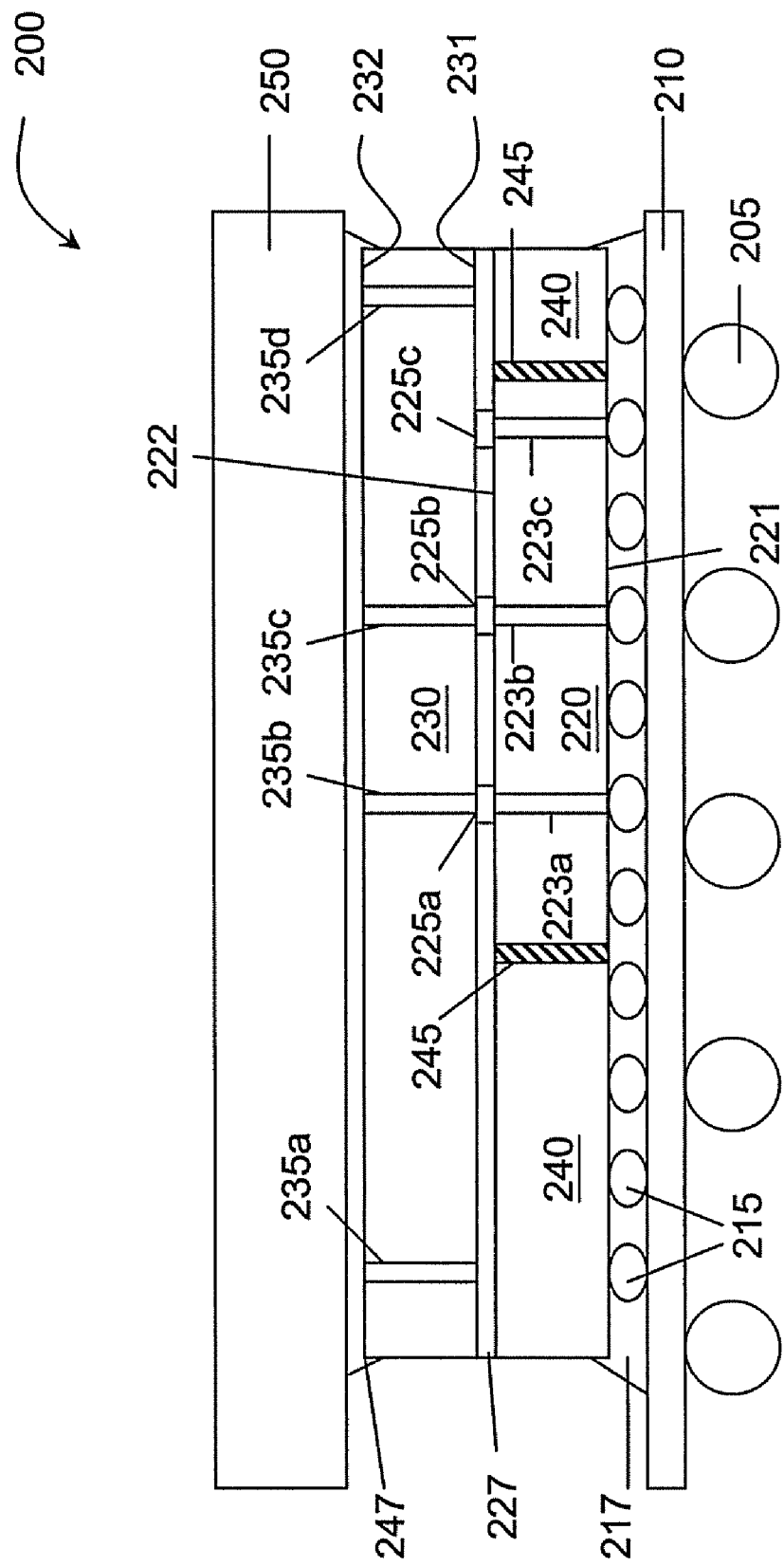

FIG. 2C is a schematic cross-sectional view of an exemplary embodiment, wherein the die 220 (defined between isolation regions 245) is smaller than the die 230. Like items shown in FIGS. 2A and 2C are identified by the same reference numerals. Conductive structures 223a-223c, 225a-225c and 235a-235d shown in FIG. 2A are analogous to the conductive structures 223, 225 and 235 as shown in FIG. 2A, respectively. The conductive structures 223a-223c, 225a-225c and 235a-235d are identified with suffixes for illustrating features of exemplary embodiments as described below. In FIG. 2C, the support structures 240 are disposed over the substrate 210. The support structures 240 are located between the substrate 210 and the die 230 for providing desired mechanical support for the mounting of the die 230 and/or heat spreader 250.

Figure 2D:
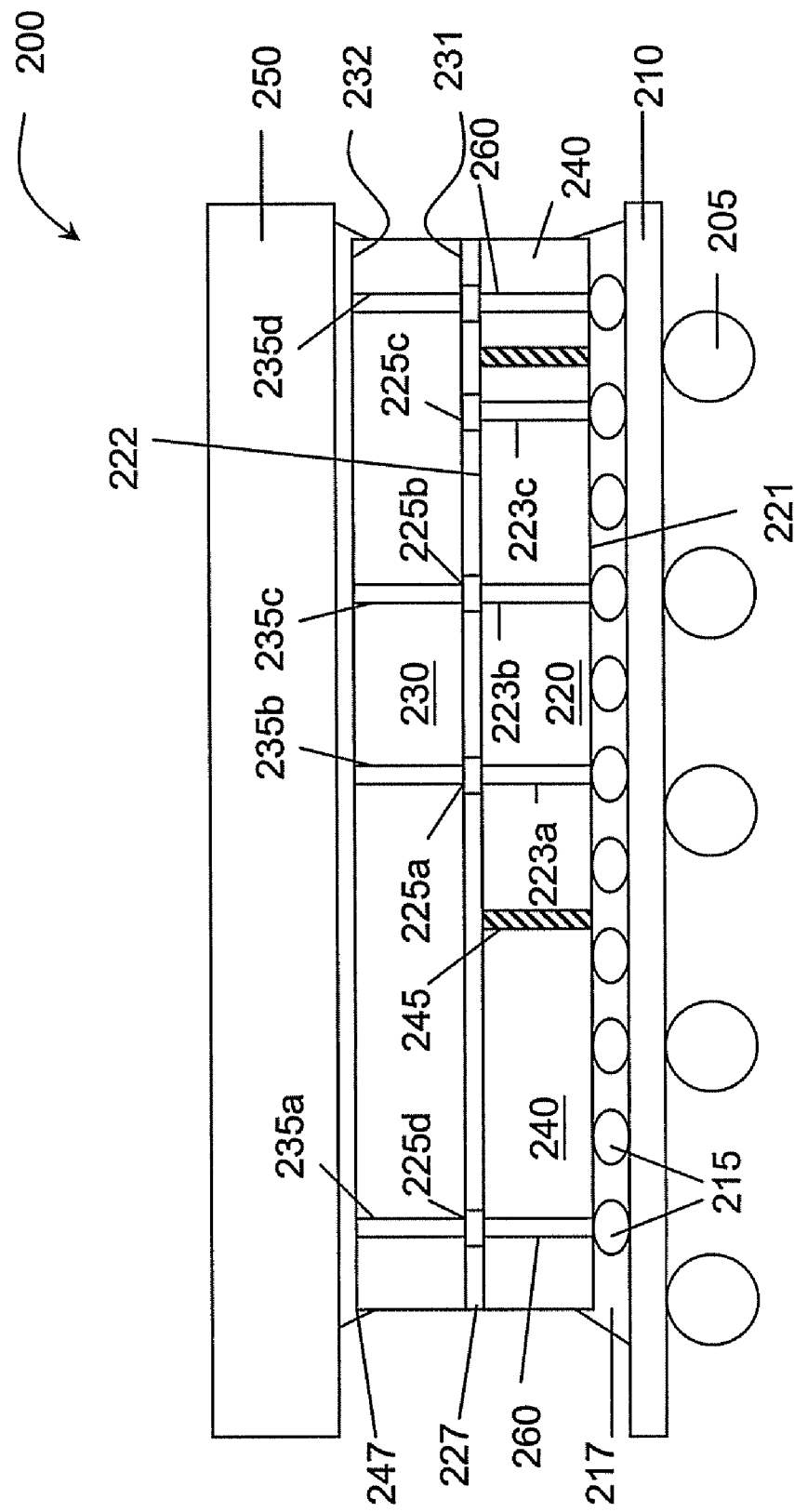

FIG. 2D is a schematic cross-sectional view of another exemplary embodiment, wherein the die 220 is smaller than the die 230. Like items shown in FIGS. 2B, 2C and 2D are identified by the same reference numerals. The conductive structures 223a-223c, 225a-225d and 235a-235d are also identified with suffixes. In FIG. 2D, the support structures 240 mounted between the substrate 210 and the die 230 not only provide desired mechanical support for the mounting of the die 230 and/or heat spreader 250, but also provide thermal dissipation channels, through which heat created on the surface 221 of the die 220 attached to the bump structures 215 can be dissipated to the heat spreader 250.

Further, the conductive structures 260 formed through the support structure 240 also provide electrical transmissions between the die 230 and substrate 210. For example, the active region (not shown) of the die 230 is formed on the surface 231 of the die 230. An electrical signal (e.g., current, generated at the surface 231 of the die 230 near to the conductive structure 235a) is transmitted by a metal pattern (not shown) formed in the active region to the conductive structure 225a as shown in FIG. 2C. The electrical signal is then transmitted by the conductive structures 225a and 223a to the bump structure 215 and the substrate 210. Accordingly, the metal pattern formed in the active region of the die 230 shown in FIG. 2C is complex. With the support structure 240 as shown in FIG. 2D, the signal generated at the surface 231 of the die 230 near to the conductive structure 235a can be transmitted to the bump structure 215 by the conductive structures 225d and 260. Accordingly, the routing of the metal pattern (not shown) formed in the active region of the die 230 shown in FIG. 2D can be simplified. Parasitic capacitances inherently occurring within the active region can also be effectively reduced.

Figure 2E:
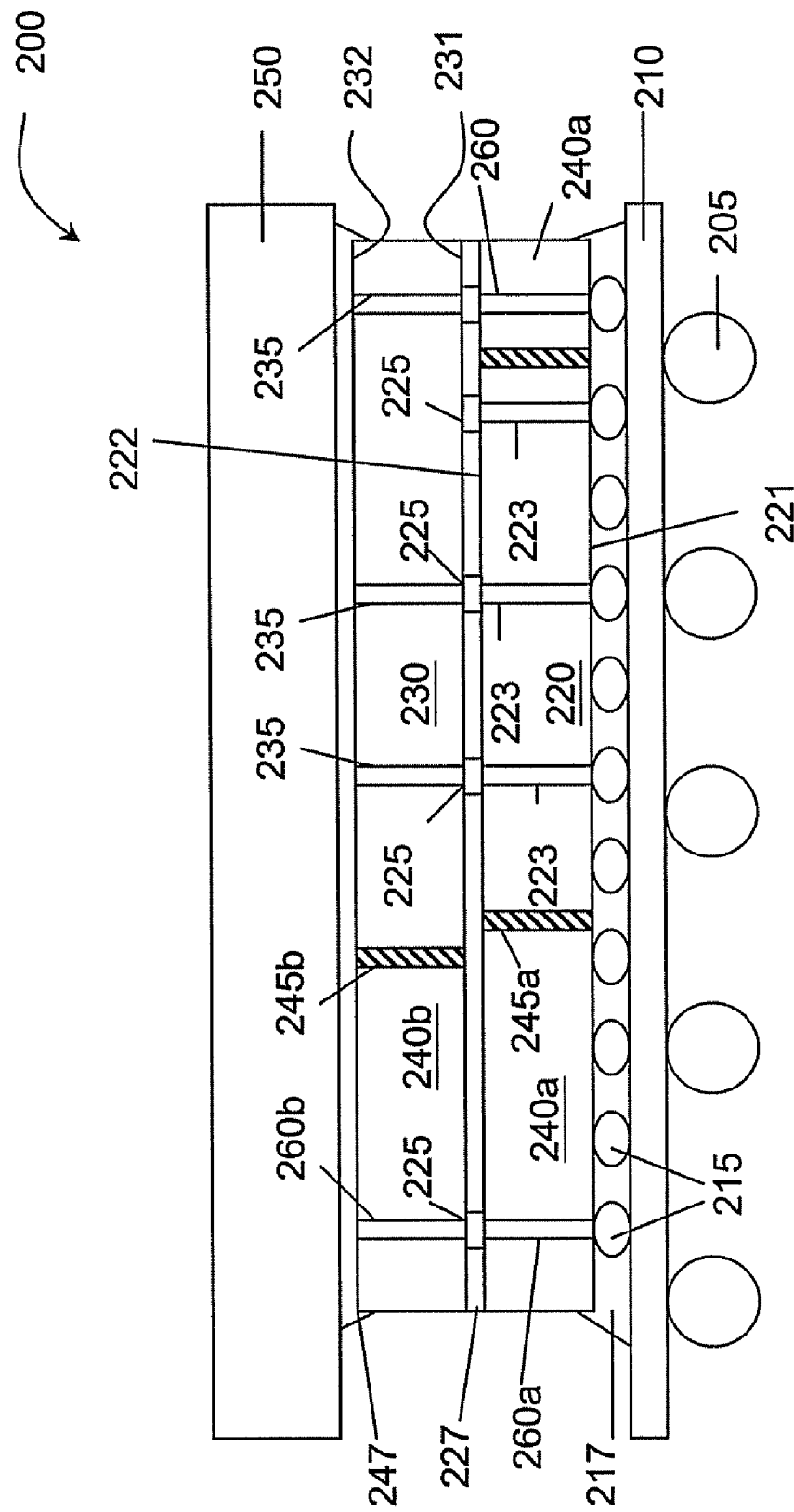
Figure 2F:
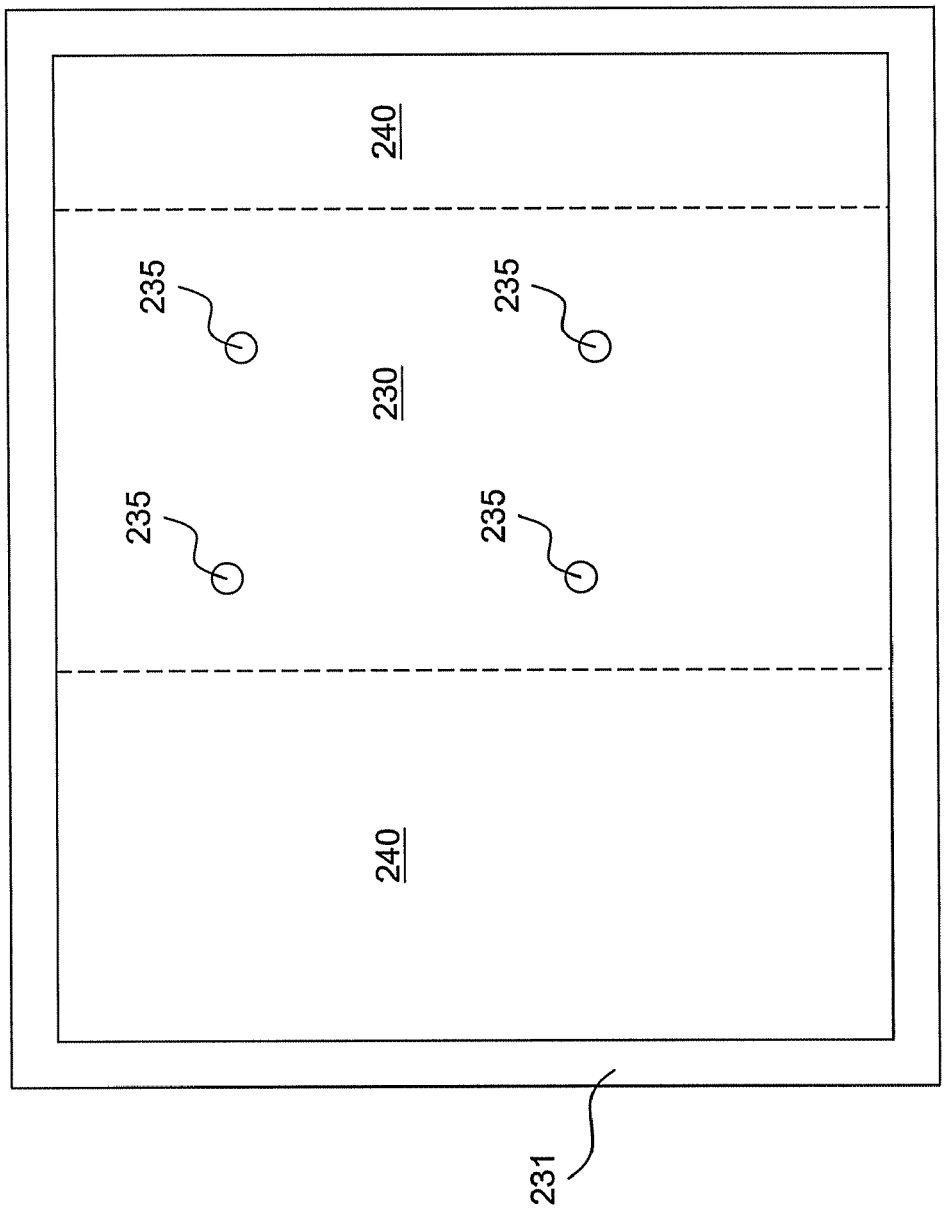
FIG. 2F is a schematic top view of the die region and support structure region of FIG. 2A.
Figure 2G:
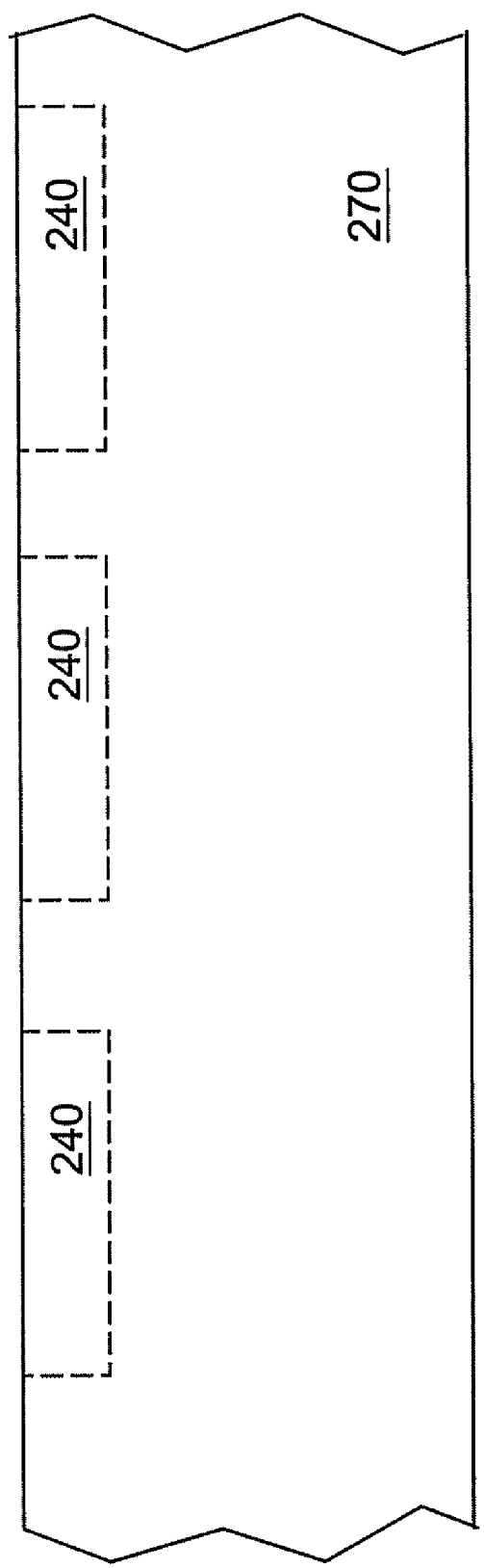
FIG. 2G is a schematic cross-sectional view of support structures formed within a substrate.

In other embodiments as shown in FIG. 2E, two support structures 240a and 240b, each of which is as same as or similar to the support structure 240 described above, are sequentially provided over the substrate 210 and adjacent or abutting respective dies 220 and 230 to provide desired mechanical support, thermal dissipation and/or electrical transmission. That is, support structures 240a and 240b are provided in both of the die layers, instead of only having support structures around the top die 230 (FIG. 2A) or only around the bottom die (FIG. 2C). Conductive structures 260a and 260b are the same as, or similar to, the conductive structures 260 as described above. Isolation layers 245a and 245b are same as, or similar to, the isolation layers 245 described above. As shown in FIG. 2E, the stacked structure is larger at least in length (horizontal direction in FIG. 2E) than either die 220 or 230. FIG. 2E also shows that one or both of the dies can extend to at least one of the edges of the stacked structure. In this example, the top die 230 extends to the right side of the stacked structure, but terminates on its left side at the isolation structure 245b. Though this stacked structure includes the dimensions extending over the dies 220 and 230, the stacked structure is practical if desired mechanical support, thermal dissipation and/or electrical transmission can be achieved.

FIGS. 3A-3F are schematic cross-sectional views showing exemplary stacked structures with three dies. In FIGS. 3A-3F, like items are indicated by reference numerals having the same value as in FIG. 2A, increased by 100.

Figure 3A:
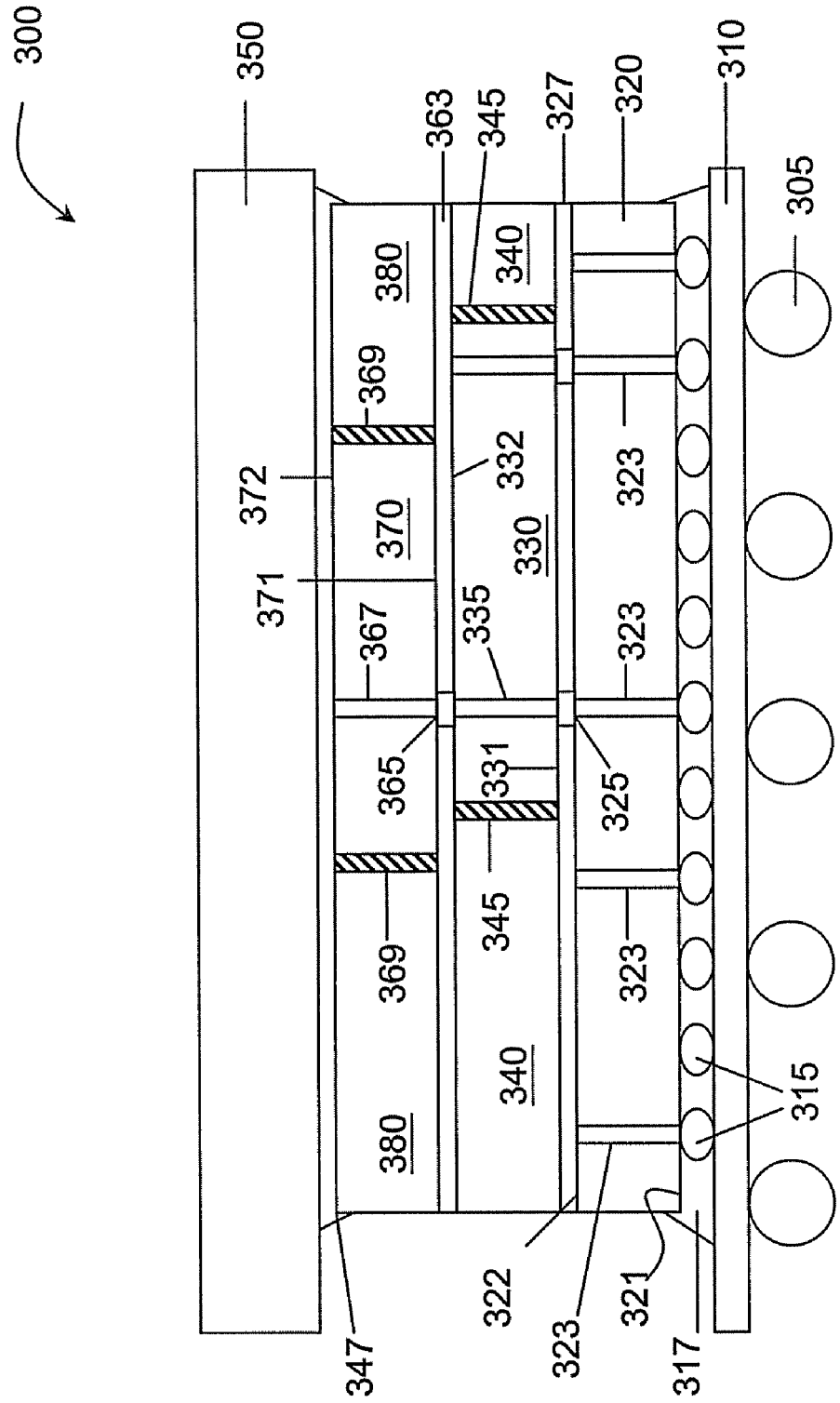
FIGS. 3A-3F are schematic cross-sectional views showing exemplary stacked structures with three dies.

As shown in FIG. 3A, the die 370 is mounted over the die 330 between isolation structures 369, which are shown with cross-hatching in FIG. 3A. The die 370 may be mounted over the die 330 by, for example, a metal bonding process, oxide bonding process or adhesive bonding process. In some embodiments, the die 370 is flipped and mounted to the die 330. In other embodiments, the die 370 is directly mounted to the die 330 without flipping.

In some embodiments, the dimension of the die 370 is smaller than that of the die 330 at least in the horizontal length direction shown in FIG. 3A. The die 370 may comprise a P-type or N-type silicon substrate, III-V compound substrate, display substrate such as a liquid crystal display (LCD), plasma display, electro luminescence (EL) lamp display, or light emitting diode (LED) substrate. In some embodiments, the die 370 may also comprise at least one conductive structure, e.g., conductive structure 367, formed therethrough. The conductive structure 367 provides electrical and/or thermal coupling between the surface 372 of the die 370 attached to the heat spreader 350 and another surface 371 of the die 370 attached to the die 330. In some embodiments, the conductive structure 367 is the same as, or similar to, the conductive structures 323 or 335. Further, the die 370 comprises an active region (not shown) in which transistors, devices and/or circuits (not shown) are formed. The active region of the die 370 can be formed at the surface 372 of the die 370 attached to the heat spreader 350 or the surface 371 of the die 370 attached to the die 330. Further, the active region of the die 370 may be coupled to the active region of the die 330 by at least one conductive structure 365, such as a pad or bump. The active region of the die 370 may also be coupled to the active region of the die 320 and the substrate 310 by the conductive structures 365, 335, 325, 323 and/or the bump structures 315. The conductive structures 367 may comprise, for example, an aluminum (Al) layer, copper (Cu) layer, AlCu layer, gold (Au) layer, lead-tin (PbSn) layer or other conductive layer. In some embodiments, an isolation layer 363, such as an epoxy layer, is formed between the dies 330 and 370 to isolate the active regions of the dies 330 and 370 and the conductive structures 365. The isolation layers 363 and 369 may be similar to each other and can be formed by the same process. In some embodiments, the method of singulating the die 370 is the same as, or similar to, the method of singulating the die 220 described in connection with FIG. 2A. After electrical testing, backside milling and die-sawing, the die 370 is mounted over the die 330.

Another support structure, such as support structures 380, is provided over the die 330 and/or the support structures 340. The structures 380 are provided adjacent to the die 370 and have a height substantially equal to that of the die 370. In other words, the top surface of the support structure 380 is substantially coplanar with the top surface 372 of the die 370. In some embodiments, the area of the top surface of the support structure 380 is about 20% or more of the area of one of the dies 320, 330 and 370, whichever is larger. For example, as shown in FIG. 3A, the die 320 is larger than the dies 330 and 370, and the area of the top surface of the support structure 380 is about 20% or more of the area of die 320. In some embodiments, the support structure 380 may comprise a silicon substrate, III-V compound substrate, printed circuit board (PCB), conductive substrate, plastic substrate or other substrate through which a conductive structure can be formed. In some embodiments as shown in FIG. 3A, no conductive structure is formed through the support structures 340 and 380. In these embodiments, the support structures 340 and 380 are located between the heat spreader 350 and die 320, to provide desired mechanical support when the heat spreader 350 is mounted over the die 370. The support structures 380 can be formed in the manner described above in connection with the formation of the support structure 240. In some embodiments, the die 370 and support structures 380 are formed from the same substrate as also described above.

Figure 3B:
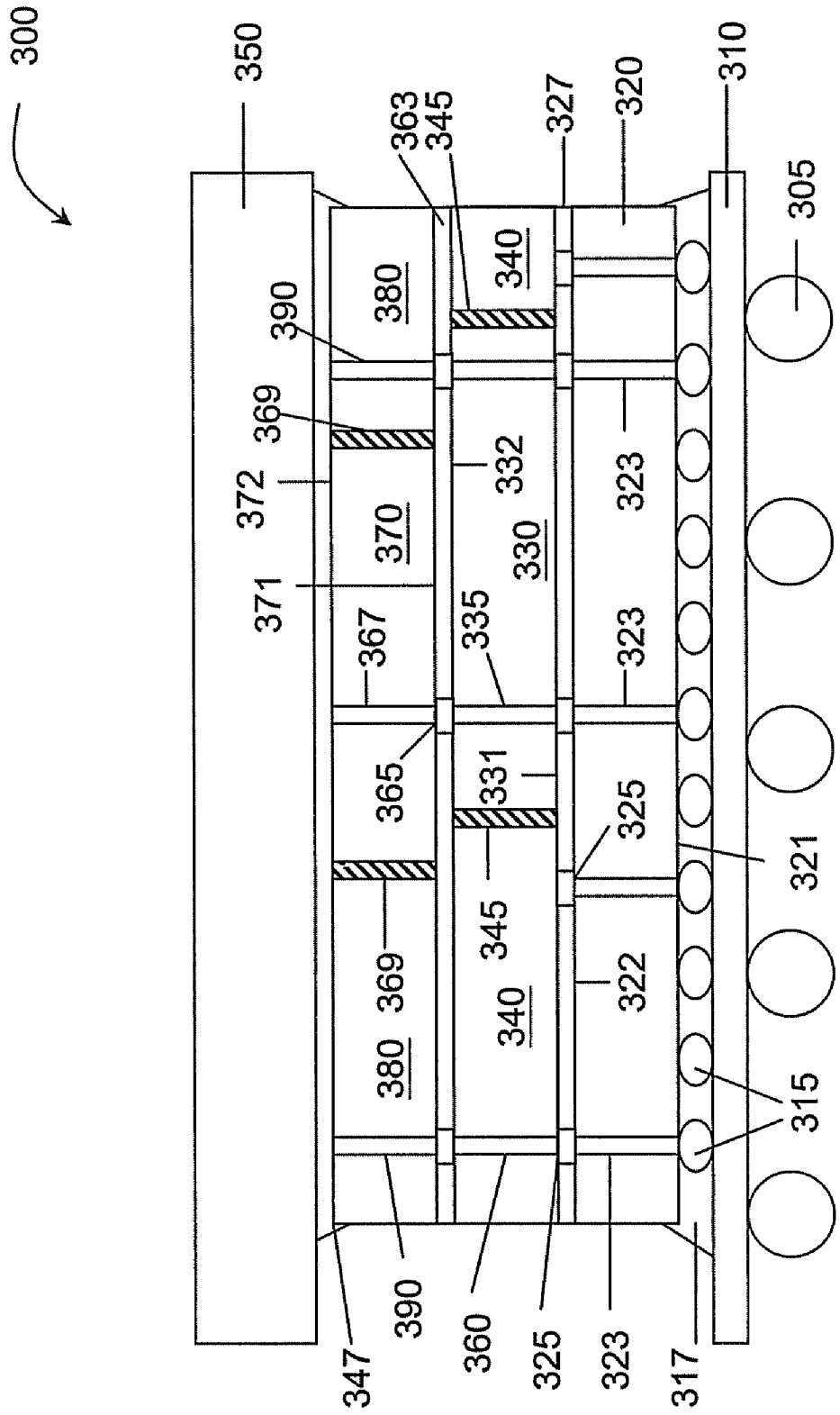

FIG. 3B is a schematic cross-sectional view of another exemplary 3-die stacked structure in which the support structures 340 and 380 comprise at least one conductive structure, such as conductive structures 360 and 390, respectively, formed therethrough. Like items shown in FIGS. 3A and 3B are identified by the same reference numerals. As shown in this figure, heat created at the surface 321 of the die 320 attached to the bump structures 315 is dissipated not only by the conductive structures 323, 325, 335, 365, 367 and the adhesive layer 347 to the heat spreader 350, but also by the conductive structures 323, 325, 360, 365, 390 and the adhesive layer 347 to the heat spreader 350. Further, heat created at the surfaces 322 and 331 of the dies 320 and 330, respectively, can be conducted not only by the conductive structures 335, 365, 367 and the adhesive layer 347 to the heat spreader 350, but also by the conductive structures 335, 365, 390 and the adhesive layer 347 to the heat spreader 350. Accordingly, the support structures 340 and 380 are provided between the heat spreader 350 and the die 320, not only to provide mechanical support for the mounting of the heat spreader 350, but also to provide thermal dissipation channels therebetween.

In some embodiments, either the support structures 340 or 380 have the conductive structures 360 or 390, respectively. For example, the structures 380 include the conductive structures 390 formed therethrough, but the support structures 340 do not include the conductive structures 360 formed therethrough. For these embodiments, the support structures 380 provide channels for thermal dissipation and/or mechanical support. The support structures 340, without the conductive structures 360 formed therethrough, provide mechanical support for the mounting of the heat spreader 350. One of ordinary skill in the art can readily modify the support structures 340 and 380 to obtain desired thermal dissipation and/or mechanical support for the mounting of the heat spreader 350.

In some embodiments, the dimensions of the die 370 are substantially similar to those of the die 320. For these embodiments, the support structures 380 and isolation layers 369 are omitted. Further, in addition to thermal dissipation, the conductive structures 325, 360, 365 and/or 390 may also provide channels for signal transmissions as described above in connection with FIGS. 2C-2D. In other embodiments, additional support structures (not shown), with or without conductive structures formed therethrough, are provided over the substrate 310 adjacent to the die 320. In these embodiments, each of the dies 320, 330 and 370 has a support structure 380 provided adjacent thereto. As with the stacked structure 200 described in connection with FIG. 2E, though the horizontal dimension of the stacked structure 300 is larger than those of the individual dies 320, 330 and/or 370, desired mechanical support, thermal dissipation and/or signal transmission can be achieved.

Figure 3C:
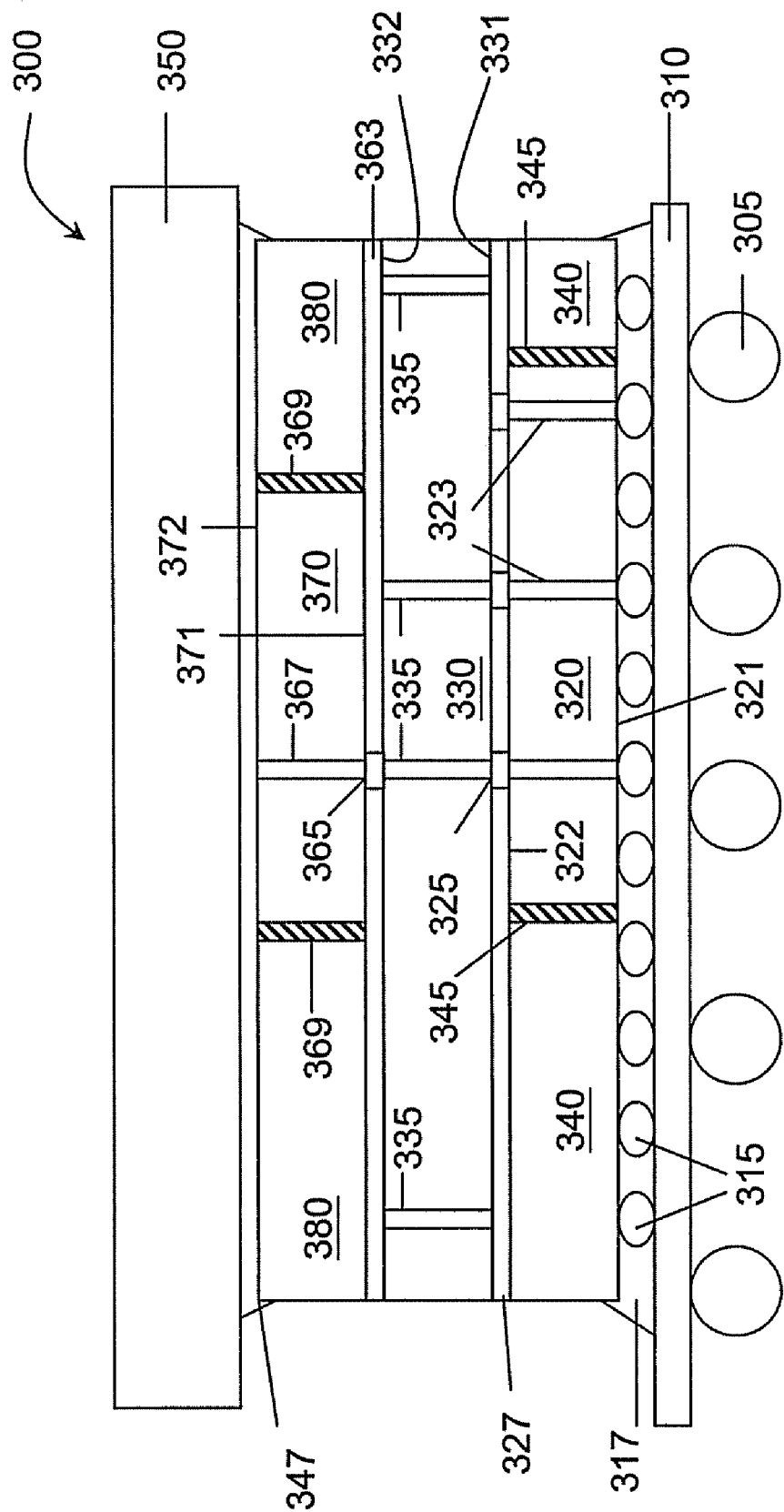

FIG. 3C is a schematic cross-sectional view of an exemplary embodiment, wherein the die 330 is larger than the dies 320 and 370. Like items shown in FIGS. 3A and 3C are identified by the same reference numerals. In this figure, the support structures 340 and 380 are provided between the substrate 310 and die 330 and between the heat spreader 350 and die 330, respectively. The support structures 340 are provided over the die 320 to provide desired mechanical support for the mounting of the dies 330, 370 and/or the heat spreader 350. The support structures 380 are provided over the die 330 to provide desired mechanical support for the mounting of the heat spreader 350.

Figure 3D:
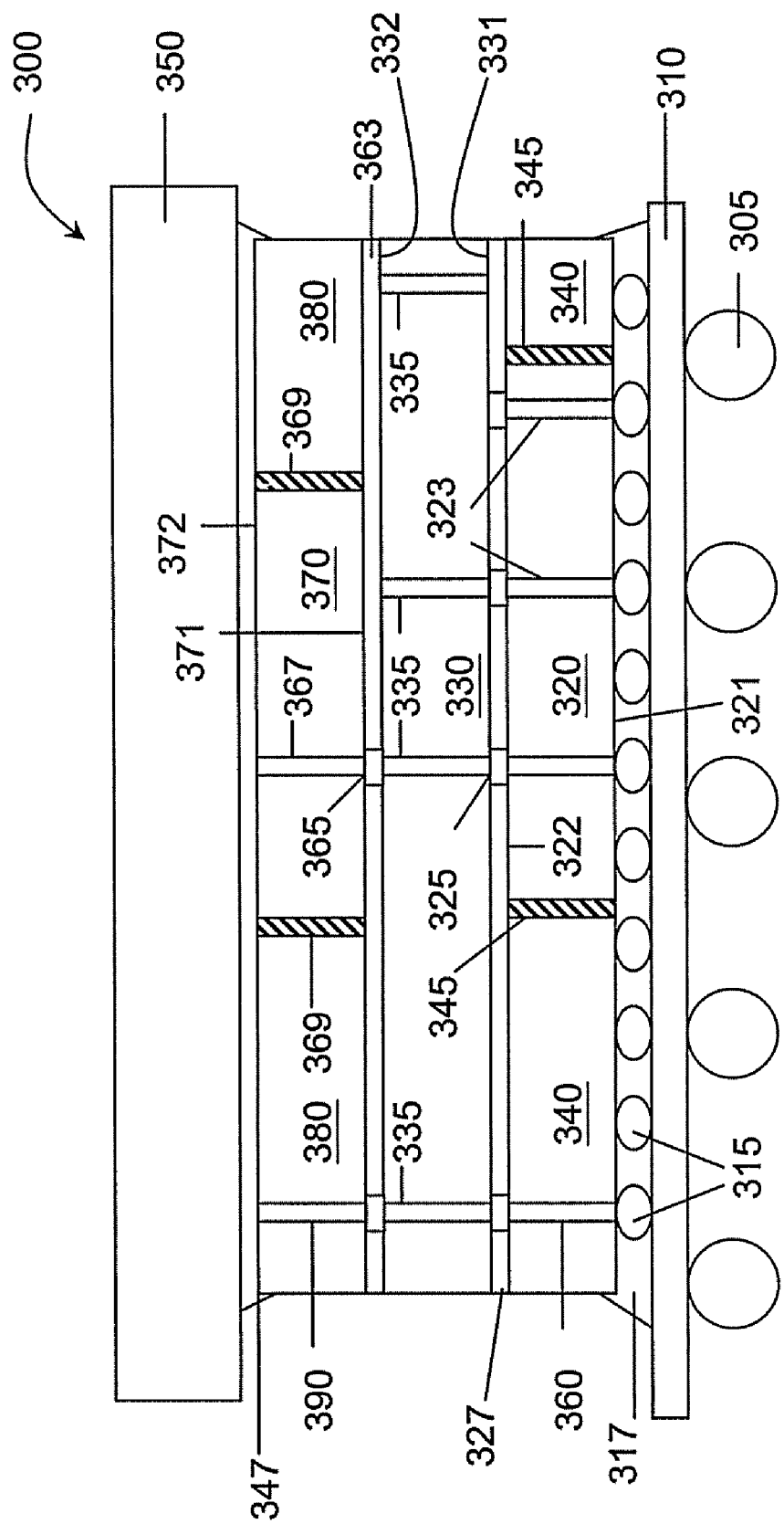

FIG. 3D is a schematic cross-sectional view of another exemplary embodiment, wherein the die 330 is larger than the dies 320 and 370, and the support structures 340 and 380 include conductive structures 360 and 390, respectively, formed therethrough. Like items shown in FIGS. 3B and 3D are identified by the same reference numerals. In this figure, the support structures 340 and 380 mounted between the substrate 310 and the die 330 and between the heat spreader 350 and the die 330, respectively, not only provide desired mechanical support for the mounting of the dies 330, 370 and/or the heat spreader 350, but also provide channels for thermal dissipation and/or signal transmission by the conductive structures 325, 335, 360, 365 and/or 390.

Figure 3E:
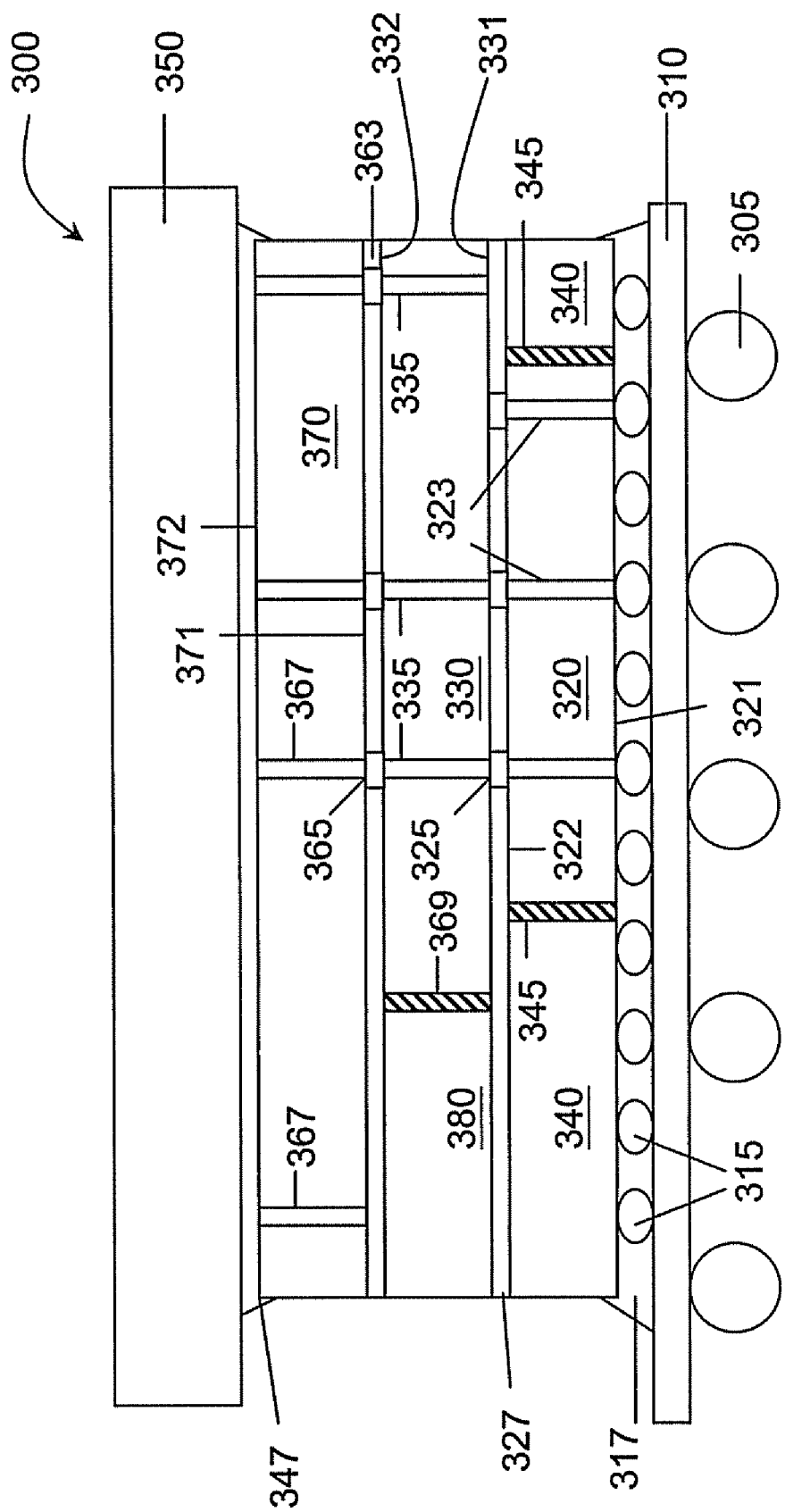

FIG. 3E is a schematic cross-sectional view of an exemplary embodiment, wherein the die 370 is larger than the dies 320 and 330, and the support structures 340 and 380 include conductive structures 360 and 390, respectively, formed therethrough. Like items shown in FIGS. 3A and 3E are identified by the same reference numerals. In this figure, the support structures 340 and 380 are provided between the substrate 310 and die 330 and between the dies 320 and 370, respectively. The support structures 340 are mounted over the substrate 310 to provide desired mechanical support for the mounting of the dies 330, 370 and/or the heat spreader 350. The support structures 380 are mounted over the die 320 to provide mechanical support for mounting of the die 370 and/or heat spreader 350.

Figure 3F:
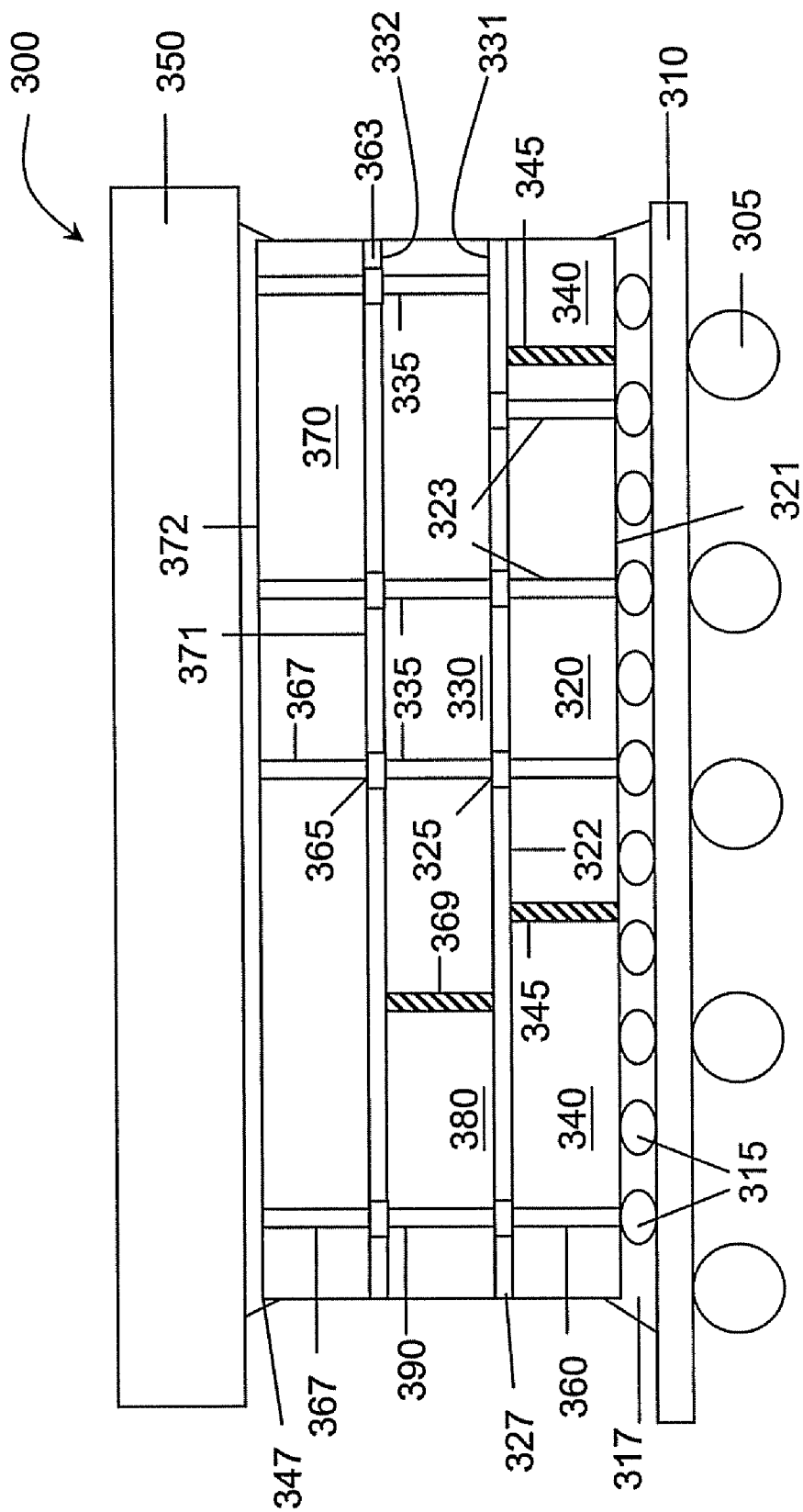

FIG. 3F is a schematic cross-sectional view of another exemplary embodiment, wherein the die 370 is larger than the dies 320 and 330. Like items shown in FIGS. 3B and 3F are identified by the same reference numerals. In this figure, the support structures 340 and 380 provided between the substrate 310 and die 330 and between the dies 320 and 370, respectively, not only provide mechanical support for mounting of the dies 330, 370 and/or the heat spreader 350, but also provide channels for thermal dissipation and/or signal transmission by the conductive structures 325, 360, 365, 367 and/or 390.

Figure 4B:
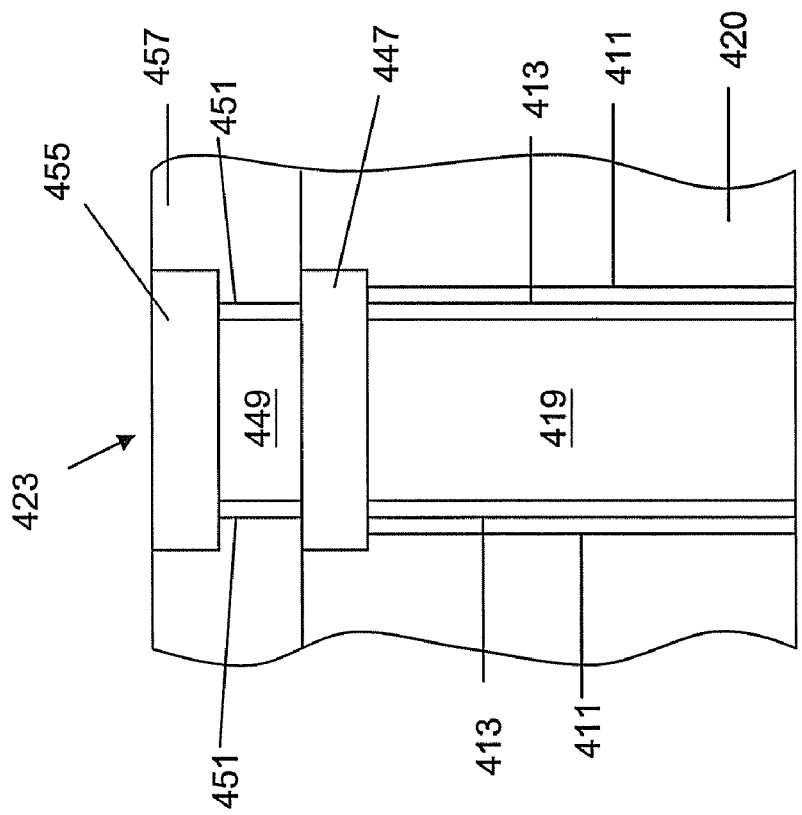
FIGS. 4A and 4B are enlarged cross-sectional views of exemplary conductive structures 423.
Figure 4A:
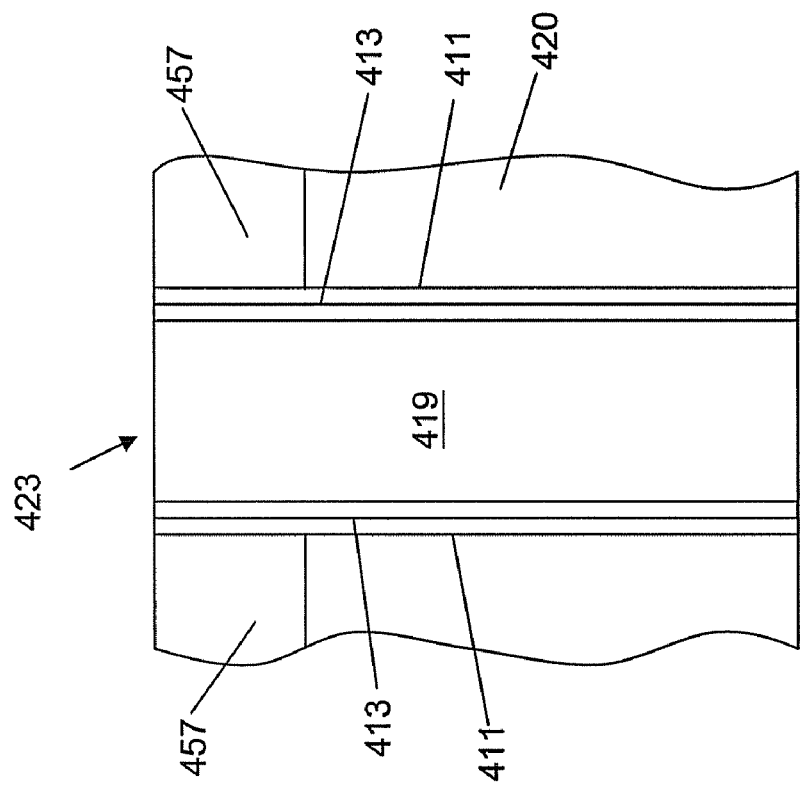

FIGS. 4A and 4B are enlarged cross-sectional views of exemplary conductive structures that may be used for conductive structures 223, 235, 323, 335 and 367 shown in FIGS. 2A-2E and 3A-3F.

As shown in FIG. 4B, the conductive structure 423 comprises dielectric layers 457, barrier layers 411, 413 and conductive layer 419 formed through the die 420. One end of the conductive structure 423 is coupled to an active region (not shown) by a metal pattern (not shown) formed on the surface 421 or 422 of the die 420. The conductive structure 423 may comprise, for example, a via structure, contact structure, trench structure, damascene structure, dual damascene structure, multi-layer interconnect structure or other structure that is able to provide an electrical path through a die.

The dielectric layers 457 can be, for example, an oxide layer, nitride layer, oxynitride layer or other dielectric layer that is capable of isolating the conductive layer 419 from the remaining portion of the die 420. The dielectric layers 457 may be formed by a chemical vapor deposition (CVD) process, for example. The barrier layers 411, 413 may comprise, for example, a titanium (Ti) layer, titanium-nitride (TiN) layer, tantalum (Ta) layer, tantalum-nitride (TaN) layer or other material layer that is capable of reducing or preventing metallic ions of the conductive layer 419 from diffusing into the surrounding regions of the die 420. The barrier layers 411, 413 may be formed by, for example, a CVD or physical vapor deposition (PVD) process. The conductive layer 419 may comprise, for example, an Al layer, Cu layer, AlCu layer, polysilicon layer or other conductive material layer. The conductive layer 419 can be formed by, for example, a CVD process, PVD process, electrochemical plating process, electro-less plating process or other process that is able to form a conductive layer.

FIG. 4B is a schematic cross-sectional view showing another exemplary conductive structure 423. In this figure, the conductive structure 423 further comprises a multi-layer structure which may include conductive layers 447, 449, 455 and barrier layers 451. The conductive layers 455, 449 and barrier layers 451 are formed within a dielectric layer 457, for example. The dielectric layer 457 may comprise, for example, an oxide layer, nitride layer oxynitride layer, low-k dielectric material layer or other dielectric layer that can isolate conductive structures within the multi-layer structure. The conductive layers 447 and 455 may comprise, for example, an Al layer, Cu layer, AlCu layer or other metal-containing layer. The conductive layers 447 and 455 can be formed by, for example, a CVD process, PVD process, electrochemical plating process, electro-less plating process or other the like. The barrier layers 451 may comprise, for example, a titanium (Ti) layer, titanium-nitride (TiN) layer, tantalum (Ta) layer, tantalum-nitride (TaN) layer or other material layer that is capable of preventing or reducing metallic ions of the conductive layer 449 from diffusing into the dielectric layer 457. The conductive layer 449 may comprise, for example, an Al layer, Cu layer, AlCu layer, polysilicon layer or other conductive material layer. In some embodiments, the multi-layer structure is a part of the active region (not shown) formed over the die 420 and can be formed by the process that forms the active region over the die 420.

In some embodiments where the conductive structures 423 of FIGS. 4A and 4B are used for conductive structures 260, 360 and 390 shown in FIGS. 2B, 2D, 2E, 3B, 3D and 3F, the dielectric layers 457 and/or barrier layers 413 of the conductive structures 460 are omitted if the isolation of conductive layers 419 and/or diffusion of metallic ions within the die 420 are not a concern. The support structures providing mechanical support, thermal dissipation and/or signal transmission may not include an active region in which devices or transistors are formed, but may include a metal pattern (not shown) formed thereover for signal transmission. Since the metal pattern may not be as sensitive as devices or transistors formed in an active region, diffusion of metallic ions of the conductive structure 419 may not adversely affect electrical characteristics of the metal pattern, thereby permitting omission of the dielectric layers 457 and barrier layers 413 of the conductive structures 260.

FIGS. 5A-5G are schematic drawings showing an exemplary process of forming the stacked-die structures of FIG. 3F. In FIGS. 5A-5G, like items are indicated by reference numerals having the same value as in FIG. 3F, increased by 200.

Figure 5A:
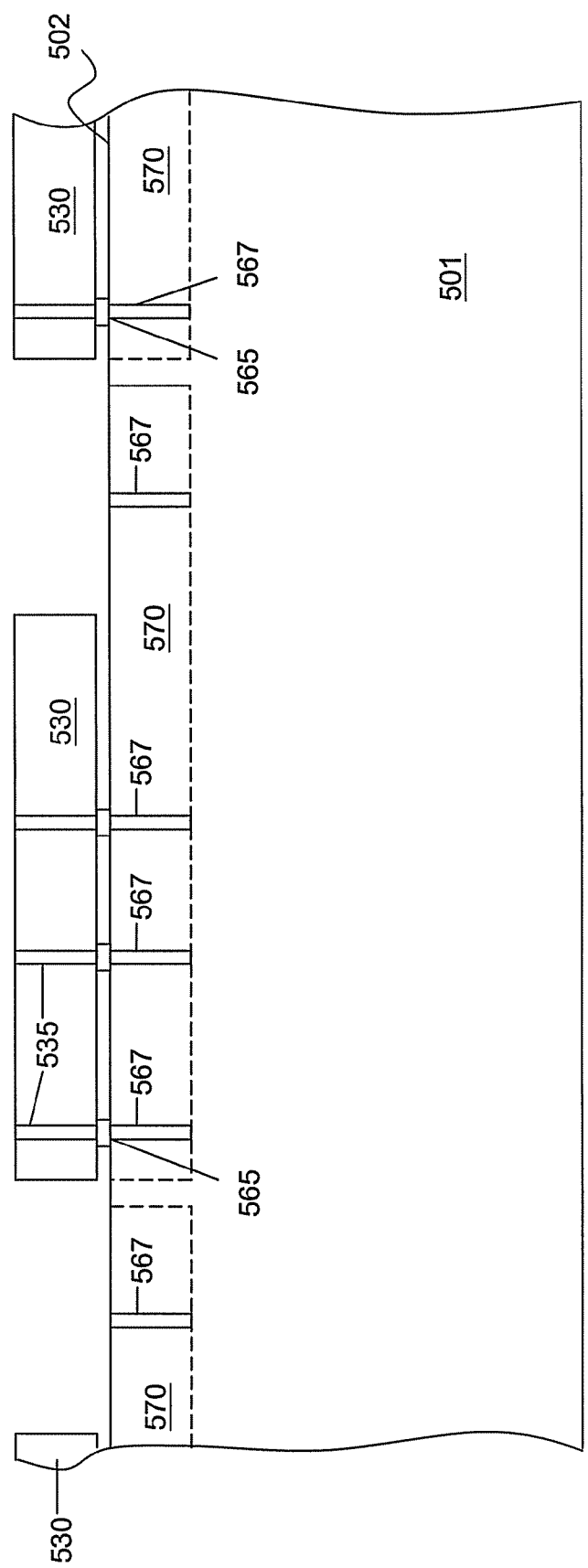
FIGS. 5A-5G are schematic drawings showing an exemplary process of forming the stacked structure of FIG. 3F.

As shown in FIG. 5A, the dies regions 570 are defined on a substrate 501. The substrate 501 can be, for example, a P-type or N-type silicon substrate, III-V compound substrate, display substrate such as a liquid crystal display (LCD), plasma display, electro luminescence (EL) lamp display, or light emitting diode (LED) substrate. In these embodiments, active regions (not shown) are formed over the surface 502 of the substrate 501 in respective dies regions 570. Conductive structures 567 are formed through the die regions 570.

The dies 530 are mounted over the substrate 501, corresponding to the die regions 570 and coupled to the die regions 510 by the conductive structures 565. The dies 530 may comprise, for example, conductive structures 535 formed therethrough. The dies 530 and can be mounted to the die regions 570 by, for example, a metal bonding process, oxide bonding process or adhesive bonding process.

Figure 5B:
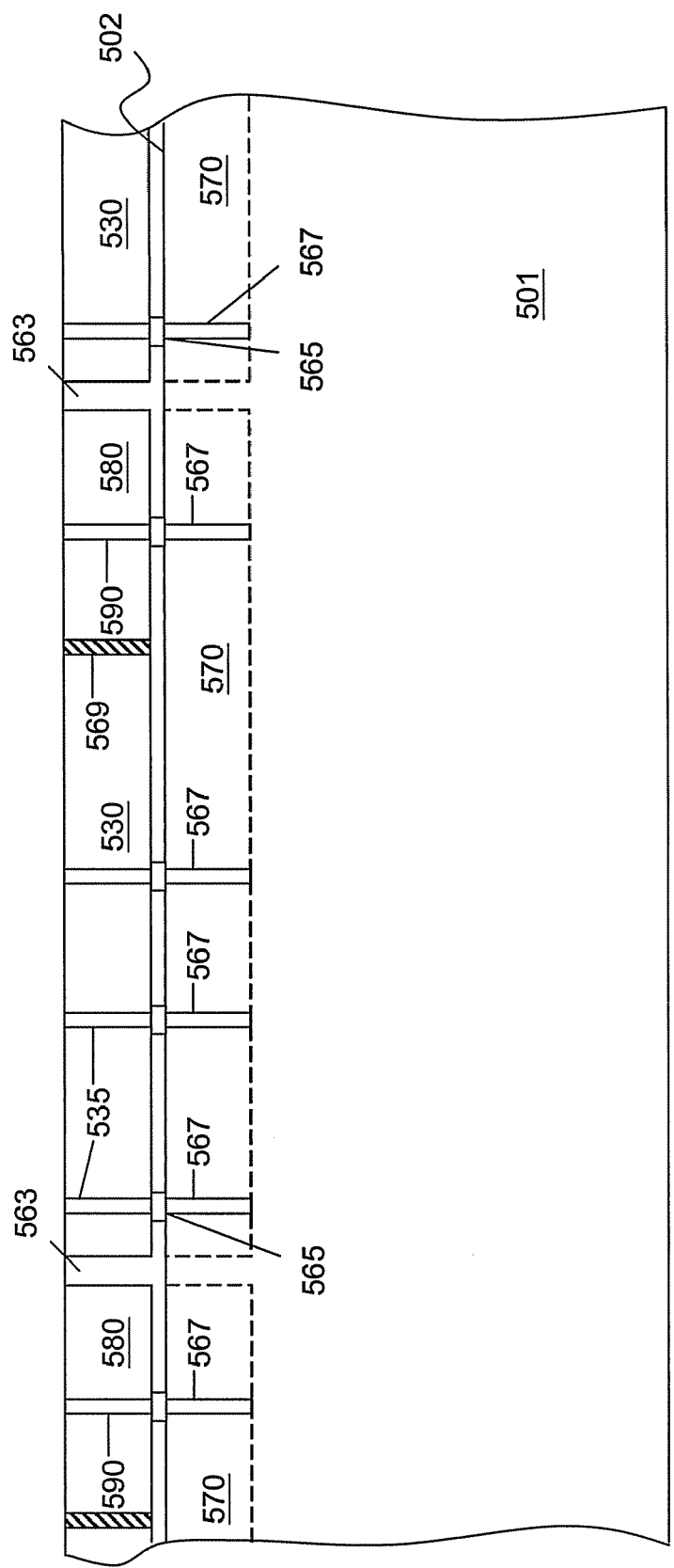

As shown in FIG. 5B, support structures 580 including conductive structures 590 formed therethrough are provided over the substrate 501 and bonded to the substrate 501 by, for example, a metal bonding process, oxide bonding process or adhesive bonding process. In some embodiments, the support structure 580 is separated from the dies 530 by isolation layers 569 and 563, e.g., epoxy layers. The isolation layer 563 also may be provided between the die 530 and the die region 570. In some embodiments, the conductive structure 590 is coupled to the conductive structure 567 by the conductive structure 565, such as a bump or bonding pad.

In some embodiments, the die 530 and support structure 580 are formed in the same substrate. For example, a substrate (not shown) comprises a pre-defined die region (provided to form a die 530 therein) and a pre-defined support structure region (provided to form a support structure 580 therein) adjacent to each other. The pre-defined die region and pre-defined support structure region are separated by a predetermined space within which no active region, transistor, diode, circuit and/or conductive structure is formed. An active region (not shown) and the conductive structures 535 are formed within the pre-defined die region and the conductive structure 590 is formed within the pre-defined support structure region. After the formation of the active region and conductive structures 535 and 590 within the pre-defined die region and support structure region, the substrate is subjected to electrical tests for detecting failing dies. After the electrical tests, the substrate is subjected to a milling process and a die-sawing process, thereby dividing the substrate into plural chips, each of which includes a die region 530 and a support structure region 580. In some embodiments, the chip has a length and width substantially similar to those of the die region 570. For these embodiments, the isolation layer 569 is omitted and replaced by the predetermined space described above and the isolation layer 563 is introduced between the die 530 and the support structure 580.

Figure 5C:
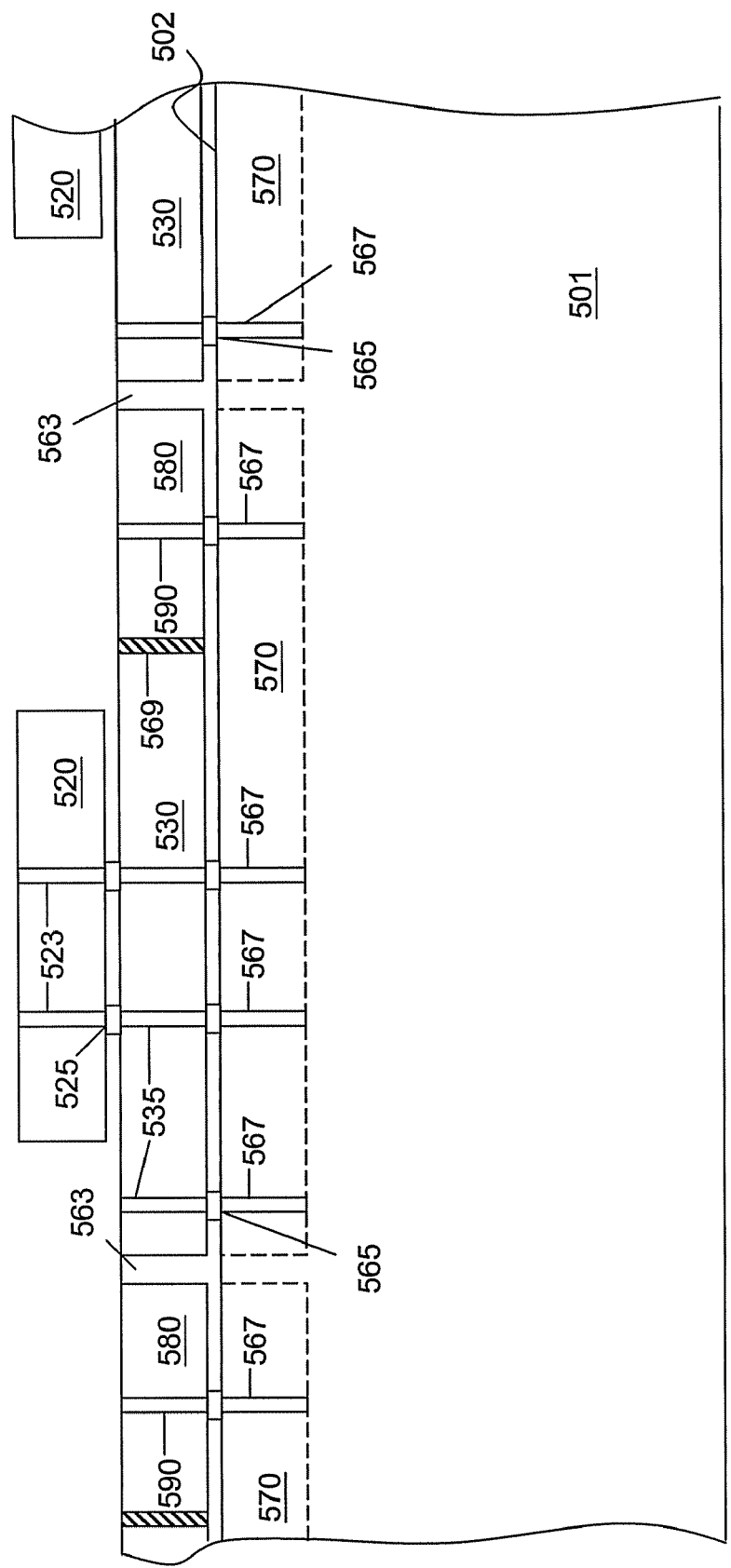

As shown in FIG. 5C, dies 520 are mounted over the respective die 530. The die 520 may comprise conductive structures 523 and can be coupled to the die 530 by the conductive structures 525. The methods described above by mounting the dies 520 may be used for mounting the dies 530.

Figure 5D:
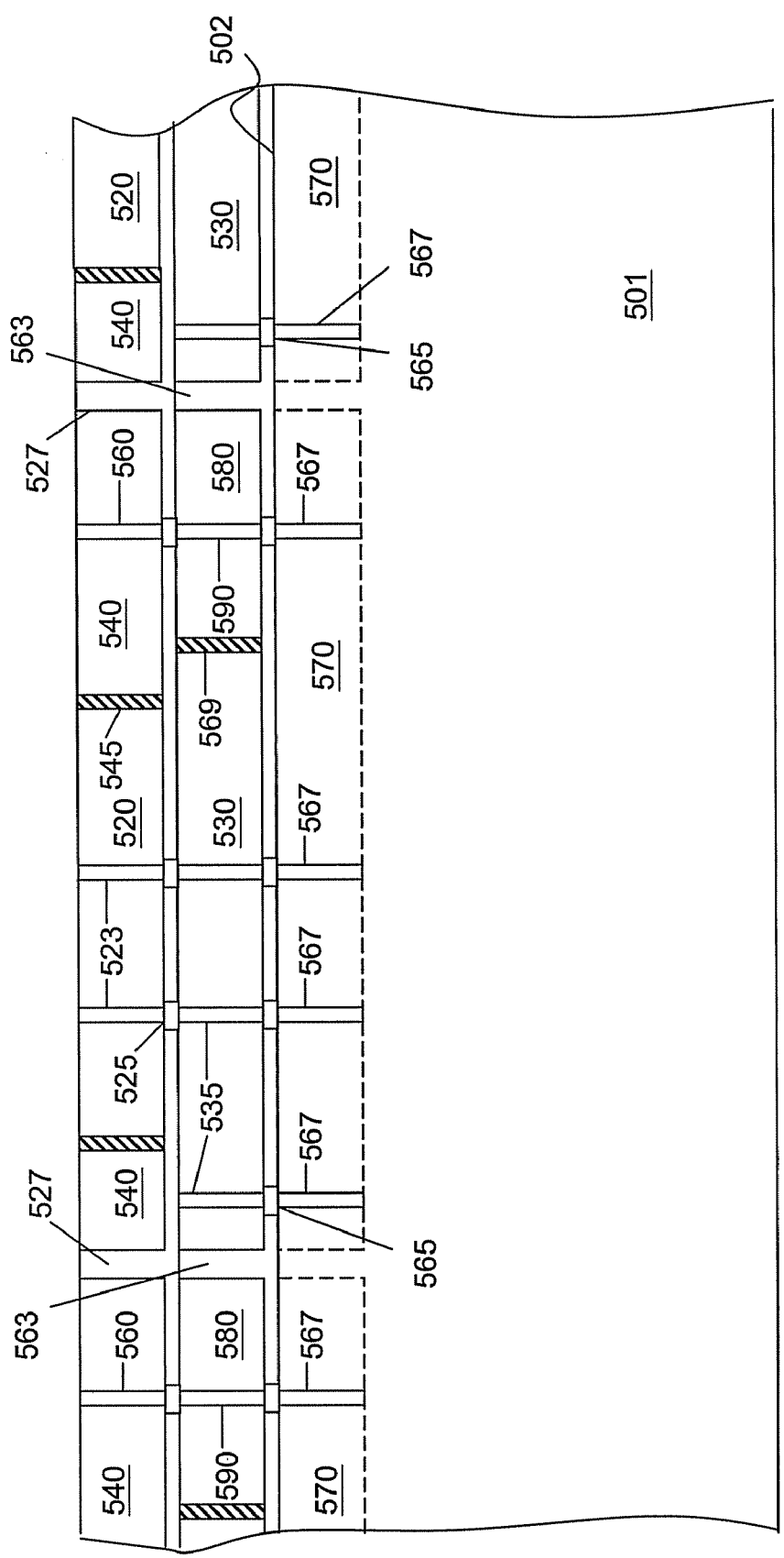

As shown in FIG. 5D, support structures 540 including conductive structures 560 formed therethrough are provided over the dies 530 and/or support structures 580 and are mounted by, for example, a metal bonding process, oxide bonding process or adhesive bonding process. In some embodiments, the support structure 540 is separated from the dies 520 by isolation layers 545 and 527, e.g., epoxy layers. The isolation layer 527 may also be introduced between the dies 530 and 520 for isolation of the conductive structures 525. In some embodiments, the conductive structure 560 is coupled to the conductive structure 590 by the conductive structure 525, such as a bump or bonding pad. In other embodiments, the die 520 and support structures 540 may be formed within the same substrate as described above in connection with the die 530 and support structure 580.

In other embodiments, after milling the substrate (not shown) including the pre-defined die region (provided to form the die 530 or 520 therein) and pre-defined support structure region (provided to form the support structure 580 or 540 therein) as set forth above, the whole milled substrates are sequentially mounted over the substrate 501. The mounted substrates are then subjected to a sawing process as described below.

Figure 5E:
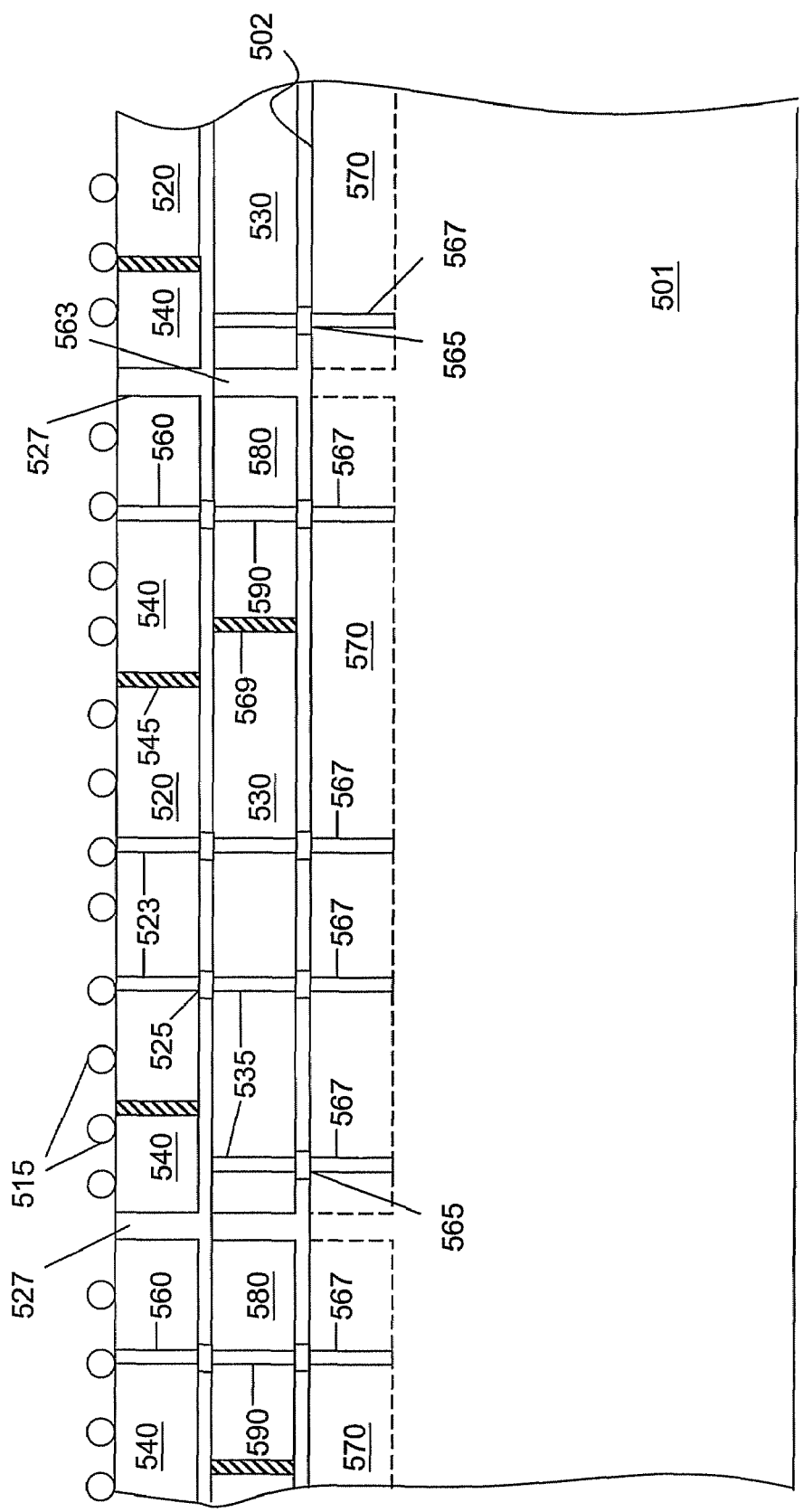
Figure 5F:
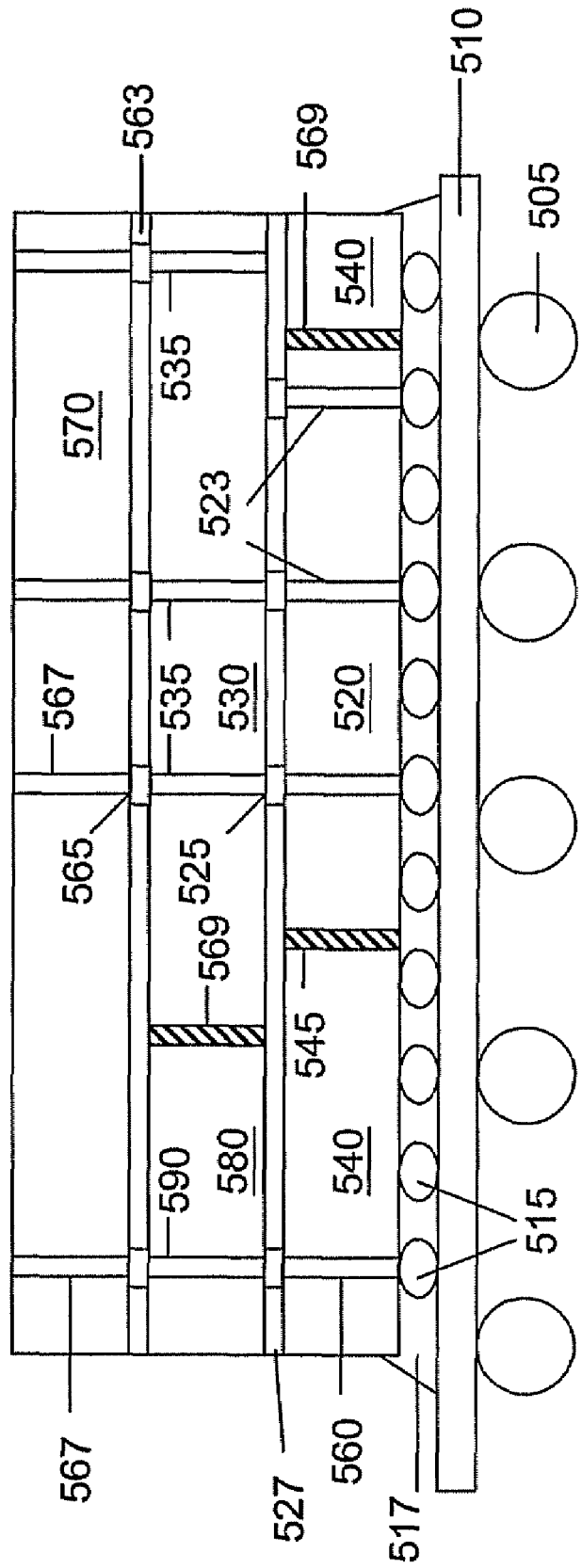

As shown in FIG. 5E, bump structures 515 are formed over the dies 520 and support structures 540 by, for example, a ball grid array (BGA) process. The bump structures 515 are provided to electrically connect the stacked dies with a substrate 510 as shown in FIG. 5F.

After the formation of the bump structures 515, the substrate 501 is subjected to a milling process and the milled substrate is then subjected to a die-sawing process along the isolation layers 527 and 563, thereby dividing the milled structure into a plurality of stacked die structures. A stacked-die structure is then flipped and mounted over the substrate 510 comprising bump structures 505 formed thereunder by, for example, a BGA process as shown in FIG. 5F. An underfill layer 517 may be introduced between the die 520 and substrate 510 for electrical isolation of the bump structures 515, and to provide mechanical support and prevent delamination.

Figure 5G:
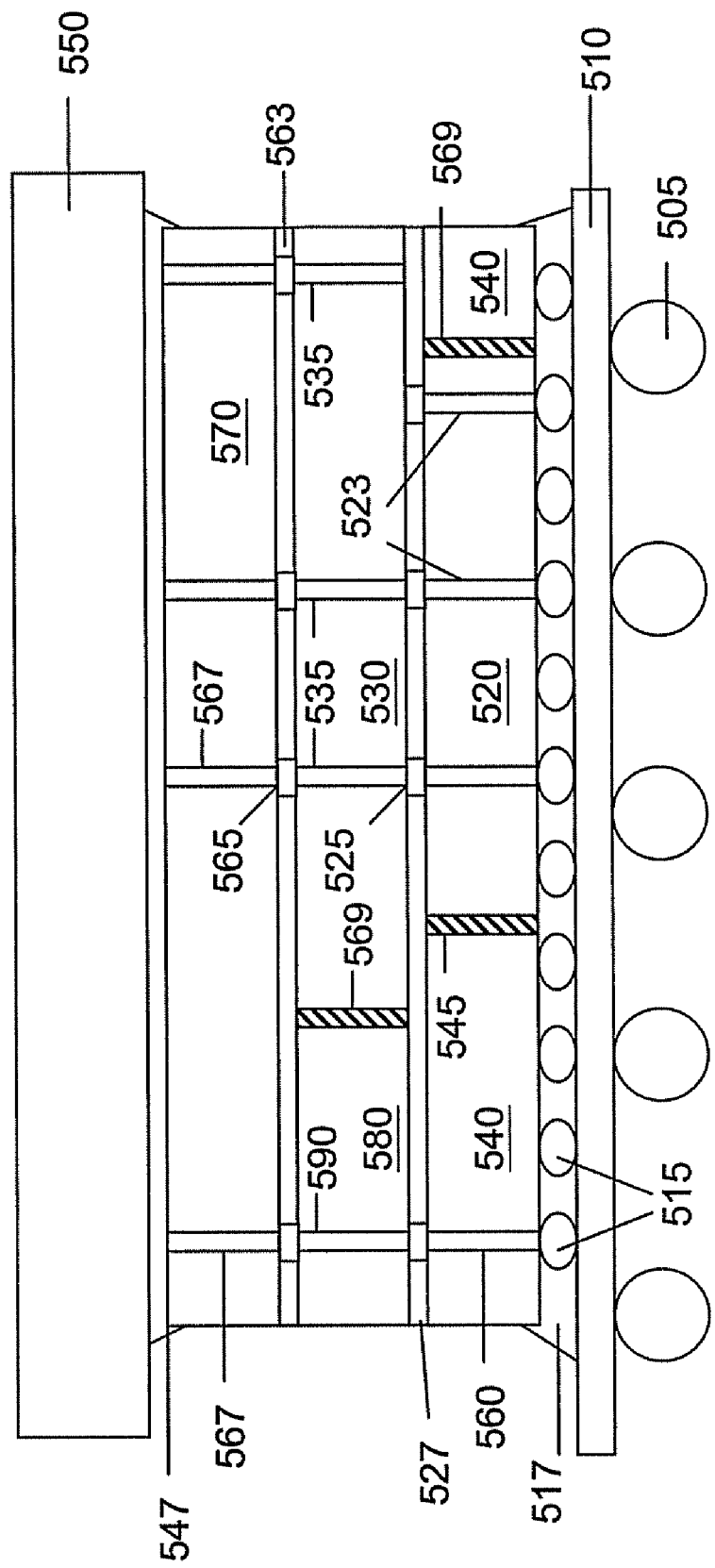

Referring to FIG. 5G, a heat spreader 550 is mounted over the die 570, and an adhesive layer 547 is introduced between the heat spreader 550 and die 570. As set forth above, the support structures 540 and 580, mounted between the substrate 510 and die 570, provide desired channels for thermal dissipation and/or signal transmission among the dies 520, 530, 570 and substrate 510.

FIGS. 5H-5L are schematic cross-sectional views showing exemplary stacked-structures with various die sizes. In FIGS. 5H-5L, like items are indicated by reference numerals having the same value as in FIG. 5E.

Figure 5H:
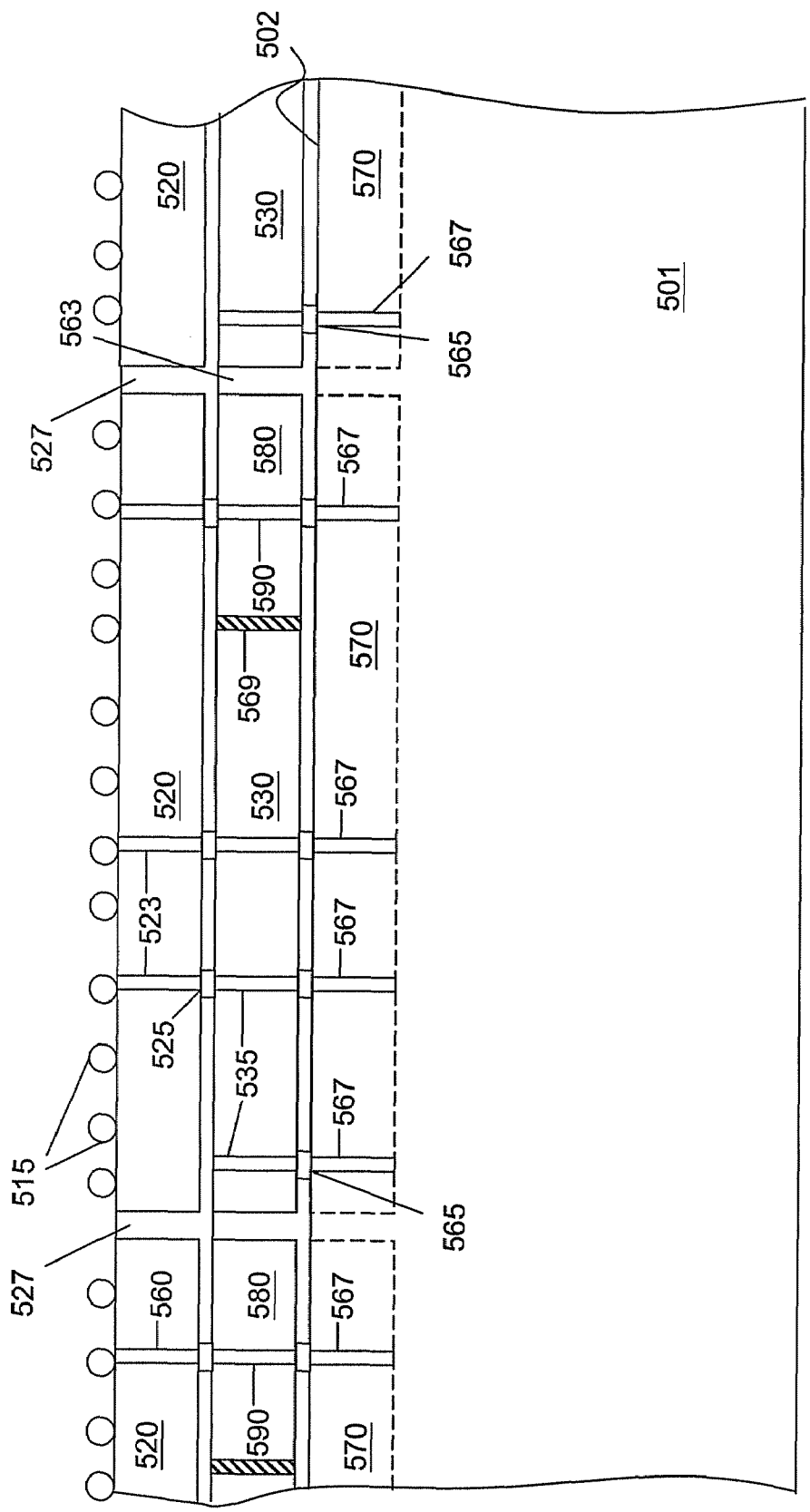
FIGS. 5H-5L are schematic cross-sectional views showing exemplary stacked-die structures with various die sizes.

As shown in FIG. 5H, the dies 520 and 570 have substantially the same length (horizontal) dimensions, so that only the support structure 580 is mounted adjacent or abutting the die 530.

Figure 5I:
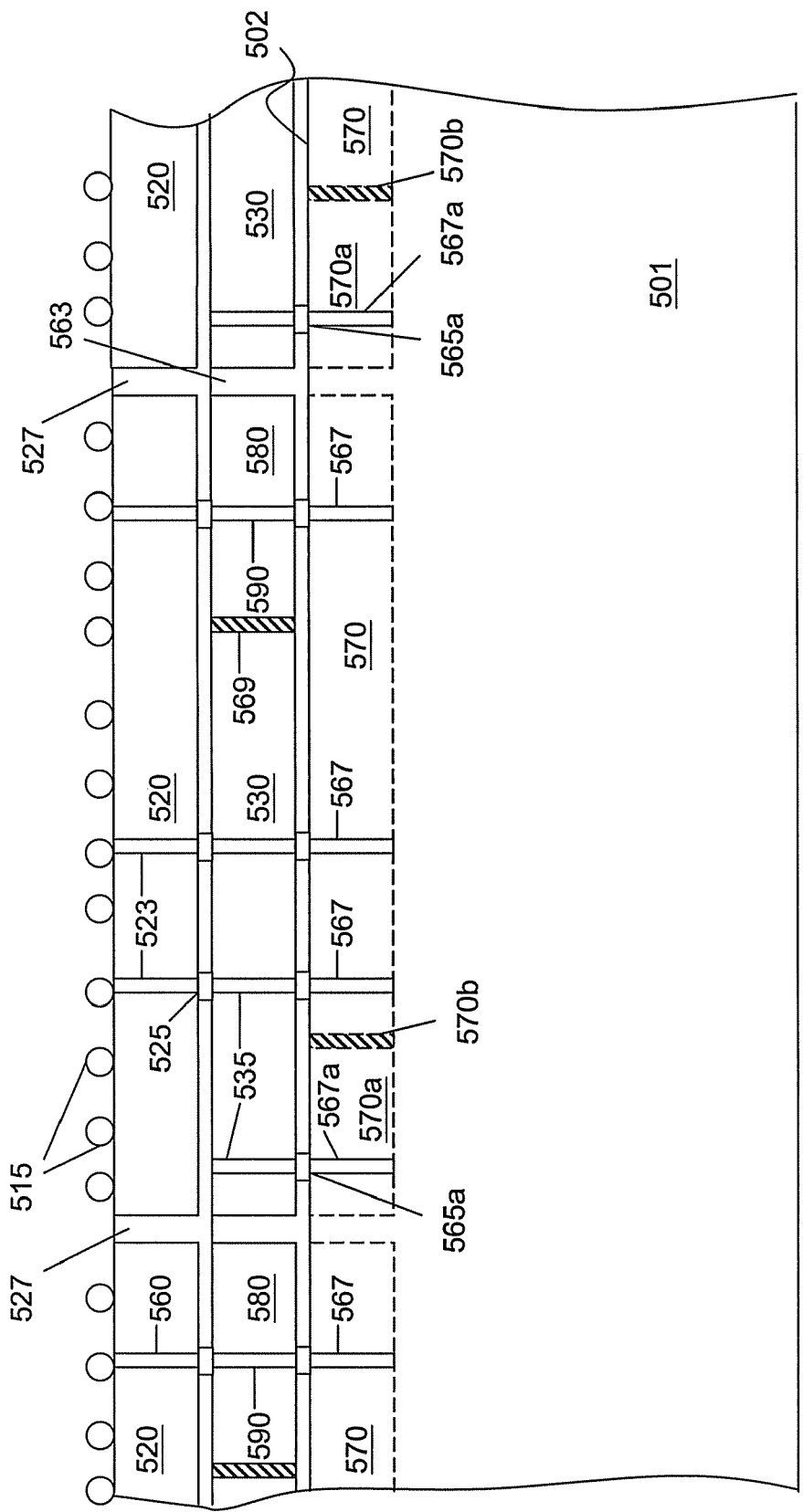

As shown in FIG. 5I, the die 520 has dimensions, at least in (length or horizontal) direction, larger than those of the dies 530 and 570. In this figure, a support structure region 570a is defined adjacent to the die region 570. The support structure region 570a is separated from the die region 570 by a predefined space 570b, which is shown in cross-hatching. The support structure region 570a is formed to provide functions analogous to those of support structures 540 and 580 set forth above. In some embodiments, the support structure region 570a comprises at least one conductive structure 567a. Further, the conductive structure 567a may be coupled to the conductive structure 535 formed through the die 530 by the conductive structure 565a.

Figure 5J:
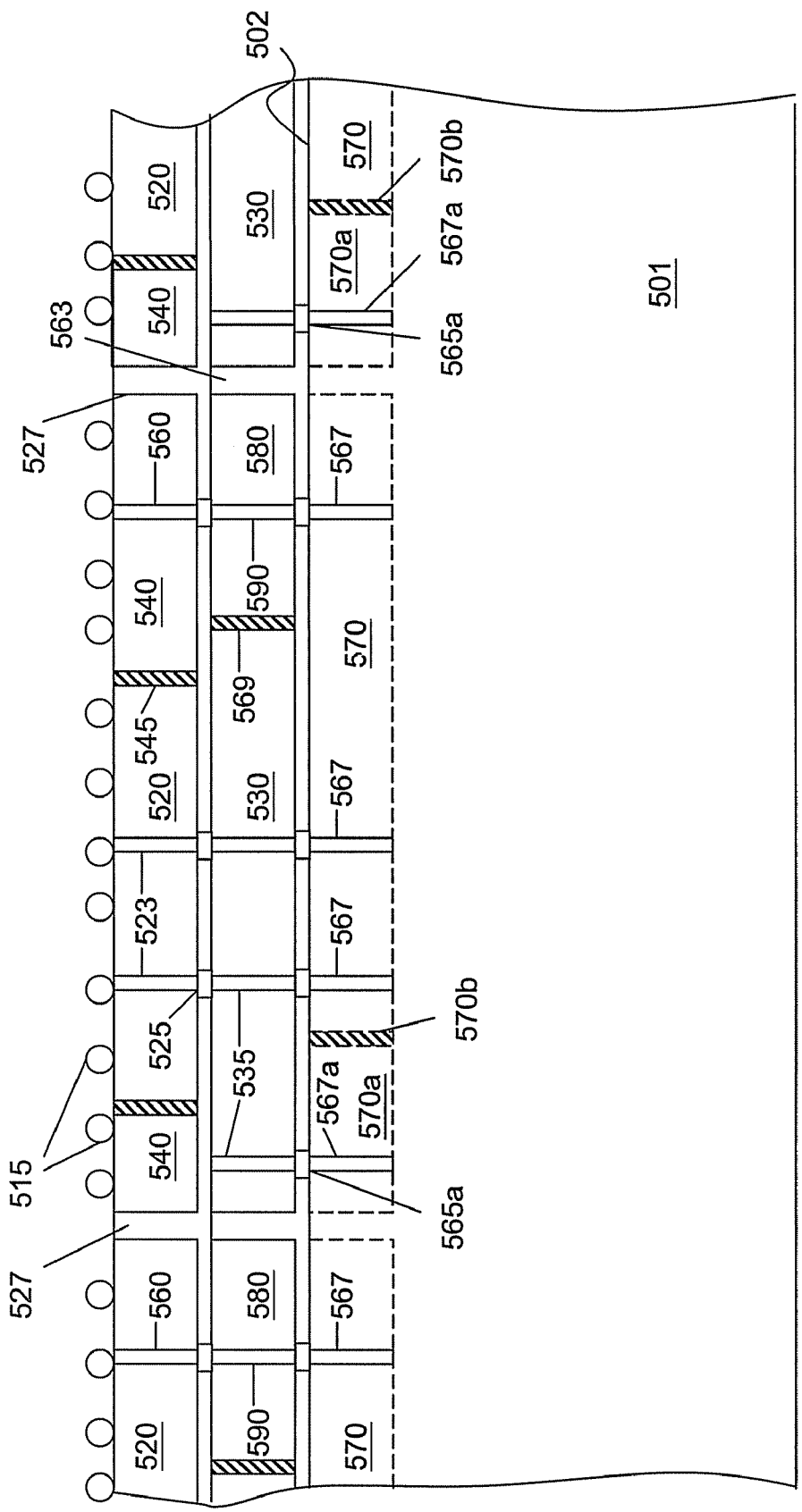

FIG. 5J is a schematic cross-sectional view showing an exemplary stacked structure which comprises one support structure adjacent to each of the dies 520, 530 and 570. This stacked-die structure has dimensions at least in the cross-sectional view larger than those of each of the dies 520, 530 and 570.

Figure 5K:
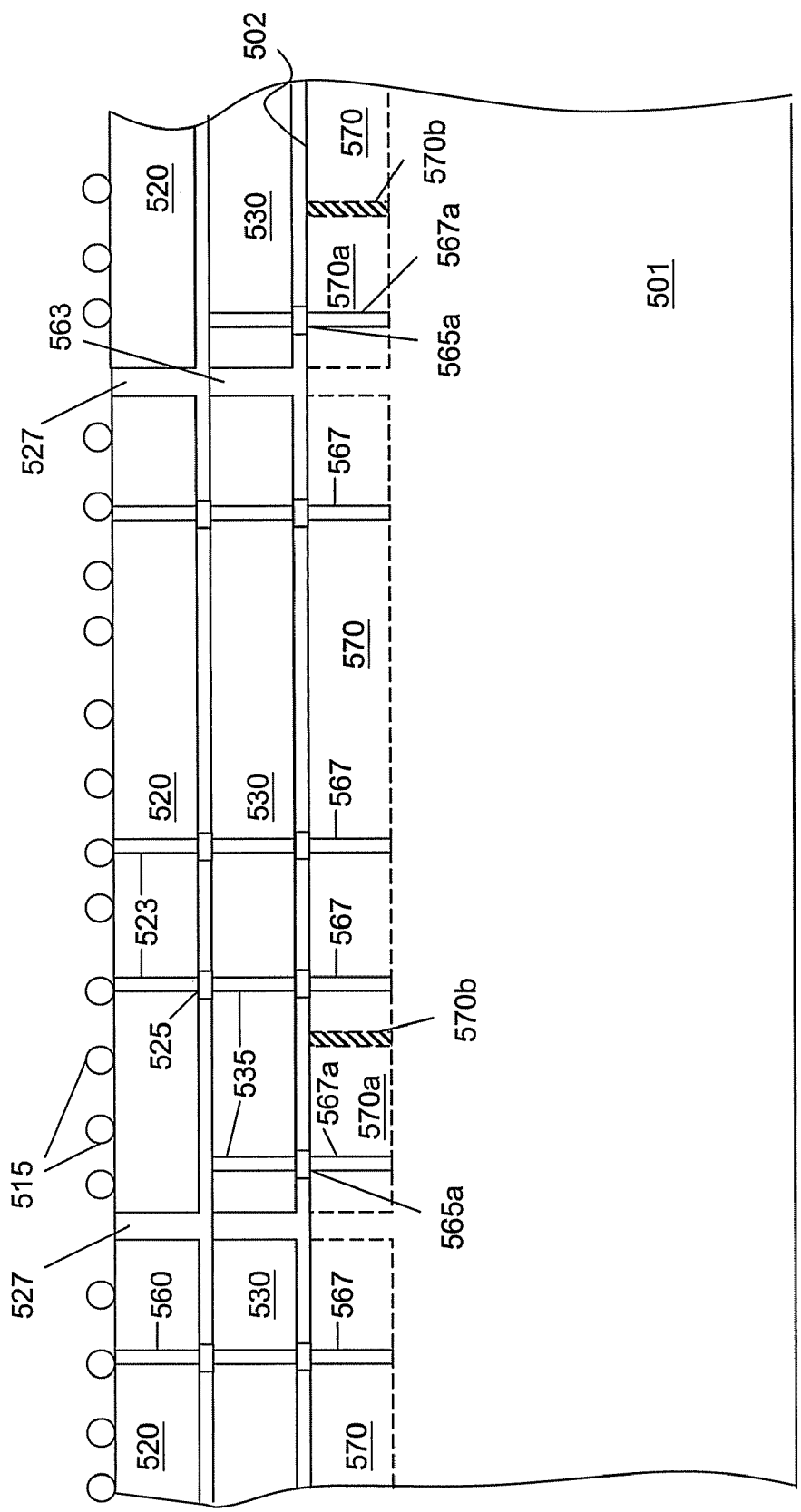
Figure 5L:
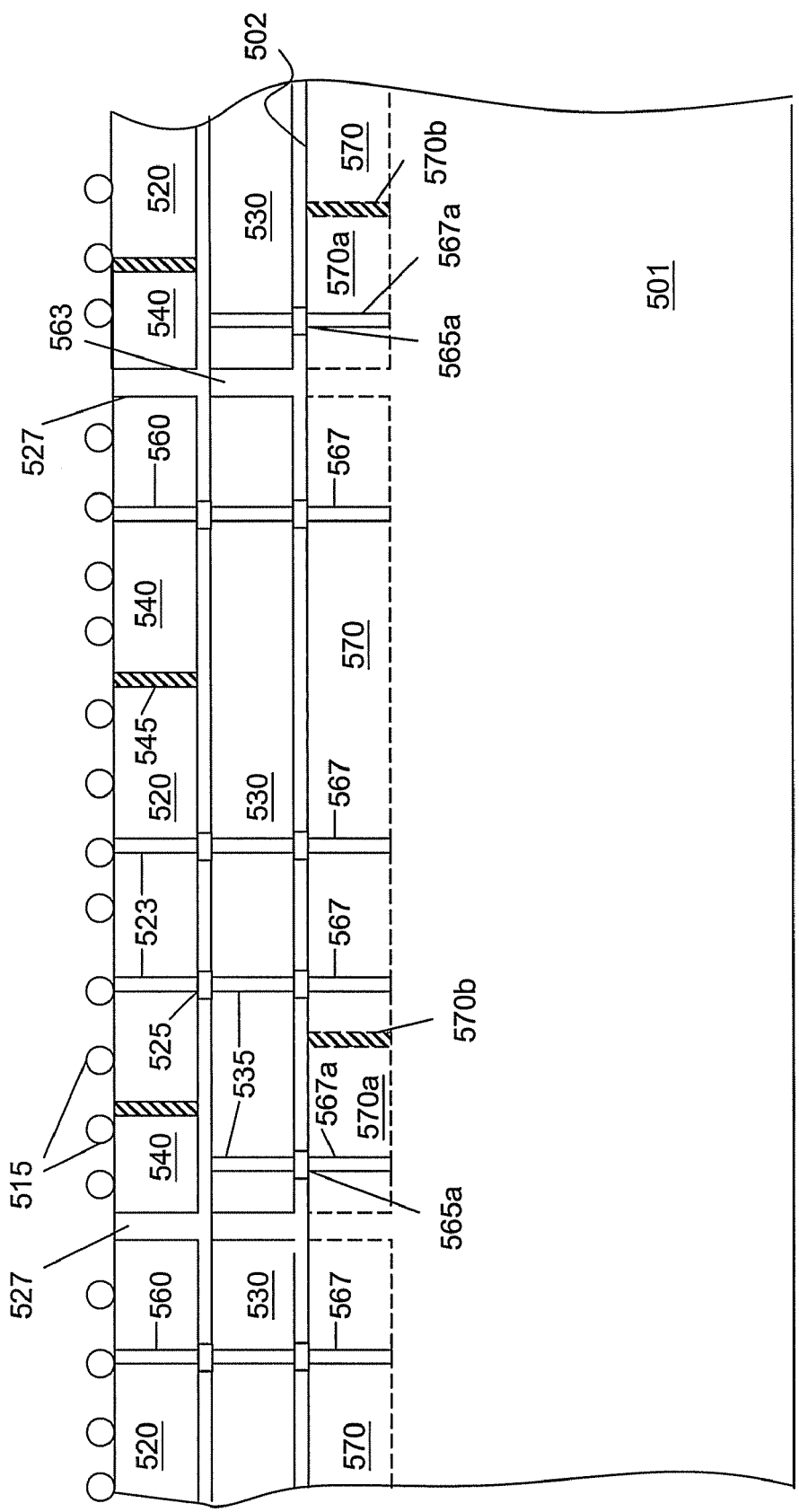

As shown in FIG. 5K, since the die region 570 is smaller at least in the horizontal (length) direction than any of the dies 530 and 540, only the support structure region 570a is formed adjacent to the die region 570 to achieve the features described above. In FIG. 5L, the die 530 has a length dimension (at least in the cross-sectional view shown) larger than those of the dies 540 and 570. By way of these conductive structures formed through these dies 520, 530 and 570 and support structures 540, 570a and 580, desired mechanical support, thermal dissipation and/or electrical transmission can be achieved.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A stacked structure, comprising:
a first die coupled to a first substrate, the first die comprising a first conductive structure formed therethrough;
a second die mounted over the first die, the second die coupled to the first substrate by the first conductive structure, wherein the second die comprises a scribe line region around a die region and at least one support structure region adjacent thereto, and the support structure region is between the die region and the scribe line region; and
a heat spreader mounted over the second die.

2. The stacked structure of claim 1, wherein the support structure region comprises at least one second conductive structure formed therethrough, and wherein the support structure region is coupled to the heat spreader by the second conductive structure.

3. The stacked structure of claim 1, further comprising a third die coupled between the second die and the heat spreader.

4. The stacked structure of claim 3, further comprising a first support structure provided between the second die and the heat spreader.

5. The stacked structure of claim 4, wherein the first support structure comprises at least one second conductive structure formed therethrough, and the first support structure is coupled to the heat spreader by the second conductive structure.

6. The stacked structure of claim 1, further comprising at least one isolation region between the die region and the support structure region.

7. The stacked structure of claim 1, wherein the support structure region has a width of about 150 μm or more.

8. The stacked structure of claim 1, further comprising:
at least one first support structure formed from a second substrate provided over the first substrate, adjacent to at least one of the first die and the second die, a top surface of the first support structure being substantially coplanar with a top surface of at least one of the first and second dies adjacent thereto.

9. The stacked structure of claim 8, wherein the first support structure comprises at least one second conductive structure formed therethrough, and wherein the first support structure is coupled to the heat spreader by the second conductive structure.

10. The stacked structure of claim 8, further comprising a third die coupled between the second die and the heat spreader.

11. The stacked structure of claim 10, further comprising a second support structure provided between the second die and the heat spreader.

12. The stacked structure of claim 11, wherein the second support structure comprises at least one second conductive structure formed therethrough, and the second support structure is coupled to the heat spreader by the second conductive structure.

13. A method of forming a stacked structure, comprising the steps of:
mounting a first die and a second die sequentially over a first substrate, the second die mounted over the first die;
providing at least one first support structure over the first substrate, wherein the first support structure is adjacent to at least one of the first die and the second die and has a top surface substantially coplanar with a top surface of at least one of the first die and second die adjacent thereto, wherein the top surface of the support structure has an area of about 20% or more of a die area of a larger one of the first and second dies, the second die being coupled to the first substrate by a first conductive structure, wherein the second die comprises a scribe line region around a die region and the at least one support structure region is adjacent thereto, and the support structure region is between the die region and the scribe line region; and
mounting a heat spreader over the second die.

14. The method of claim 13, wherein the first support structure comprises a second substrate.

15. The method of claim 14, further comprising forming at least one second conductive structure through the second substrate, wherein the first substrate is coupled to the heat spreader by the second conductive structure.

16. The method of claim 13, further comprising mounting a third die between the second die and the heat spreader.

17. The method of claim 16, further comprising providing a second support structure between the second die and the heat spreader.

18. The method of claim 17, wherein the second support structure comprises a second substrate.

19. The method of claim 18, further comprising forming at least one second conductive structure through the second substrate, wherein the first substrate is coupled to the heat spreader by the second conductive structure.

20. The method of claim 13, further comprising forming the first die and the second die in different wafers.

21. A stacked structure, comprising:
- a first die coupled to a first substrate, the first die comprising a first conductive structure formed therethrough;
- a second die mounted over the first die, the second die coupled to the first substrate by the first conductive structure;
- a first support structure formed from a second substrate provided over the first substrate, adjacent to the first die, a top surface of the first support structure being substantially coplanar with a top surface of the first die adjacent thereto;
- a second support structure formed from a second substrate provided adjacent to the second die, a top surface of the second support structure being substantially coplanar with a top surface of the second die adjacent thereto, and
- a heat spreader mounted over the second die,
- wherein the first and second support structures each comprise at least one second conductive structure formed therethrough, the second conductive structure of the second support structure being aligned with and directly contacting the second conductive structure of the first support structure, so that the first support structure is coupled to the heat spreader by the second conductive structures.

* * * * *